United States Patent [19]
Koh et al.

[11] Patent Number: 6,162,512
[45] Date of Patent: *Dec. 19, 2000

[54] PROCESS FOR MODIFYING SURFACES OF NITRIDE, AND NITRIDE HAVING SURFACES MODIFIED THEREBY

[75] Inventors: Seok Keun Koh; Hyung Jin Jung; Won Kook Choi; Yong Bai Son, all of Seoul, Rep. of Korea

[73] Assignee: Korea Institute of Science and Technology, Seoul, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/839,373

[22] Filed: Apr. 18, 1997

[30] Foreign Application Priority Data

Apr. 19, 1996 [KR] Rep. of Korea ..................... 96-11996

[51] Int. Cl.[7] .......................... C23C 14/08; C23C 14/06; H05H 1/00
[52] U.S. Cl. .......................... 427/529; 427/530; 427/533; 204/192.17
[58] Field of Search .................... 427/527, 530, 427/533, 535, 539, 585, 529, 526, 534, 564; 204/192.17

[56] References Cited

U.S. PATENT DOCUMENTS

| | | |
|---|---|---|
| 4,105,805 | 8/1978 | Glendinning et al. .................. 427/526 |
| 4,624,859 | 11/1986 | Akira et al. ............................... 427/529 |
| 4,678,678 | 7/1987 | Kamigaito et al. ...................... 427/529 |
| 4,740,267 | 4/1988 | Knauer et al. ........................... 427/527 |
| 4,832,986 | 5/1989 | Gladfelter et al. ...................... 427/255 |
| 4,908,226 | 3/1990 | Kubena et al. .......................... 427/530 |
| 5,045,345 | 9/1991 | Singer ...................................... 427/527 |
| 5,075,265 | 12/1991 | Narula .................................. 427/419.7 |
| 5,104,684 | 4/1992 | Tao et al. ................................. 427/526 |
| 5,110,407 | 5/1992 | Ono et al. ................................ 427/534 |
| 5,246,741 | 9/1993 | Ouhata et al. ........................... 427/530 |
| 5,350,607 | 9/1994 | Tyson et al. ............................. 427/564 |
| 5,356,661 | 10/1994 | Doi et al. ................................. 427/529 |
| 5,407,506 | 4/1995 | Goetz et al. ............................. 427/527 |
| 5,480,684 | 1/1996 | Sandhu .................................... 427/530 |
| 5,576,071 | 11/1996 | Sandhu .................................... 427/533 |
| 5,650,201 | 7/1997 | Tompa .................................... 427/533 |
| 5,661,115 | 8/1997 | Sandhu .................................... 427/533 |
| 5,679,411 | 10/1997 | Hoppe ..................................... 427/529 |
| 5,683,757 | 11/1997 | Iskanderova et al. .................. 427/529 |
| 5,783,641 | 7/1998 | Koh et al. . |
| 5,851,367 | 12/1998 | Nguyen et al. ......................... 427/534 |
| 5,885,666 | 3/1999 | Doll et al. ................................ 427/530 |
| 5,888,593 | 3/1999 | Petrmichl et al. ....................... 427/534 |

*Primary Examiner*—Marianne Padgett
*Attorney, Agent, or Firm*—Oblon, Spivak, McClelland, Maier & Neustadt, P.C.

[57] ABSTRACT

A process for modifying a nitride surface includes irradiating energized ion particles onto the nitride surface while blowing a reactive gas directly on the nitride surface under a vacuum condition. An aluminum nitride for a direct bond copper (DBC) can be obtained by forming a thin copper film on the thusly modified nitride.

9 Claims, 25 Drawing Sheets

Polycarbonate (PC)
Ar+Ion Irradiation with Oxygen
Dose: $5 \times 10^{16}$ Ar+/cm$^2$, O$_2$ : 4 sec
Surface Roughness: 45 Å

PROCESS FOR MODIFYING SURFACES OF NITRIDE, AND NITRIDE HAVING SURFACES MODIFIED THEREBY

BACKGROUND OF THE INVENTION

1. Field of the Invention

The present invention relates to a process for modifying surface of nitride and to nitride having surfaces modified by such process, and more particularly, to a process for irradiating energized ion particles onto the nitride surface, while blowing a reactive gas directly over the nitride surface, under a vacuum condition in order to decrease a wetting angle of the nitride surface and to increase an adhesive strength thereof.

2. Description of the Conventional Art

The wetting angle is an important factor in identifying the condition of a material surface which has been modified. A decrease in wetting angle implies that a polymer surface attracts water and also implies that the surface exhibits hydrophilicity. Thus, the occurrence of a spreading phenomenon increases when an aqueous dyestuff is applied on such a polymer surface, adhesive strength with other materials increases, and light scattering generated by condensation of water in the air onto the surface is inhibited. As described above, the surface condition of a polymer can be modified by decreasing the wetting angle.

In general, changes in wetting angle have been achieved by (1) surface roughening, (2) surface cleaning, (3) providing a coating with hydrophilic functional groups, and (4) directly synthesizing the surface with hydrophilic functional groups, while increases in adhesive strength are achieved by methods similar to those used for changing the wetting angle, namely (1) forming chemical linkages between the two materials to be adhered, (2) surface cleaning, (3) applying a material which is adhesive to the materials to be adhered, and (4) forming the surface with functional groups for assisting chemical bonds with the materials to be adhered (mainly hydrophilic functional groups).

In particular, examples of processes currently used for decreasing the wetting angle in modifying polymer surfaces include surface synthesizing with hydrophilic functional groups, high voltage corona discharge and direct current plasma discharge.

Among these, high voltage corona discharge is a process in which a polymer sample is placed in a vacuum chamber into which a reactive gas or gases are filled until atmospheric pressure is reached and then the sample is ionized by electrons emitted from electrodes to form a plasma having negative ionic charges and positive ionic charges in an electromagnetic amount equal to that of their electrons (hereinafter, referred to as "cold plasma"), and the reactive gas ions thusly formed are reacted with the sample surface to modify the surface thereof. Although this process is most widely used in modifying polymer surfaces, as disclosed in Japanese Laid-Open Patent Publication No. 60-13823 (Jan. 24, 1985), only a process of treating the surface of vinyl chloride with chlorine gas under atmospheric pressure by the use of high voltage corona discharge is disclosed, in which the wetting angle was decreased from 73° to 32°, and this decrease of wetting angle was not prominent.

Although the process is similar to that of high voltage corona discharge, direct current plasma discharge uses a plasma generated through a glow discharge (referred to as a "thermal plasma"), i.e., an ionized reactive gas or gases, which is formed after charging a reactive gas or gases in a vacuum chamber under 0.01–5 torr (atmospheric pressure is 760 torr). However, this process does not exhibit a sufficient effect in decreasing the wetting angle. For example, Japanese Laid-Open Patent Pub. No. 61-171740 (Aug. 2, 1985) discloses that the wetting angle measured after modifying the surface of polymethyl methacrylate (PMMA) polymer in argon gas under a pressure of 0.1 torr was found to be 40°, and the wetting angle increased to 60° after washing the PMMA polymer surface several times with water. Further, the wetting angle measured after modifying the surface of BX3 polymer under a pressure of 0.1 mbar (atmospheric pressure is 1013 mbar) in an oxygen gas atmosphere was found to be between 48° to 20°, when treated with an applied voltage of 10–100 W for 160 seconds [D. W. Fakes, J. M. Newton, J. F. Wattes and M. J. Edgell, Surface and Interface Analysis, vol.10 416–423(1987)].

The conventional processes, as mentioned above, cannot significantly decrease the wetting angle, whereby the effects of spreading aqueous dyestuffs on polymer surface, increasing the surface adhesive strength with other polar materials, and inhibition of light scattering because of water condensation from the air are insufficient. In addition, if the wetting angle is decreased using conventional techniques, the change in the wetting angle tends to approach a certain value according to an increase in time for surface modification, as in the case of Teflon (R) (PTFE), whereby the wetting angle with water is changed from about 95° to about 50° when using hydrogen plasma [D. T. Clark and D. R. Hutton, J.Polym. Sci., Part A, 25, 2643(1987)] or is changed from about 110° to about 70° when using a water steam plasma [D. Yousian and H. J. Griesser, Polymer, 32(6) 1126(1987)].

The present invention allows modification of material surfaces by irradiating energized ion particles onto the surfaces of a polymer, ceramic, ITO or glass, while blowing reactive gas or Cases directly over the material surface under a vacuum condition.

SUMMARY OF THE INVENTION

Accordingly, it is an object of the present invention to provide a process from modifying material surfaces by irradiating energized ion particles on the material surfaces, while blowing reactive gas or gases directly on the material surfaces under vacuum condition.

It is another object of the present invention is to provide a polymer which has a surface modified by the above process.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 5B: results of C1 analysis of sample 1-5];

[FIG. 6A: sample prior to surface modifying/ FIG. 6B: sample 1-3 / FIG. 6C: sample 1-5];

[FIG. 11A: samples 3-1 to 3-4 / FIG. 11B: samples 3-5 to 3-9 / FIG. 11C: samples 3-10, and 3-12 to 3-16];

[FIG. 12A: prior to surface modifying / FIG. 12B: after surface modifying (circular portion)];

[FIG. 13A: atmospheric exposure of sample 3-1 / FIG. 13B: samples 3-1 and 3-2 stored in water/ FIG. 13C: atmospheric exposure of samples 3-11 and 3-14 / FIG. 13D: sample 3-11 stored in water];

[FIG. 14A: results of C1 analysis of sample 3-1 / FIG. 14B: results of C1s analysis of sample 3-2 / FIG. 14C: results of O1s (Oxygen 1) analysis of sample 3-2];

[FIG. 15A: results of C1s analysis of samples 3-10 and 3-11 / FIG. 15B: results of O1s (Oxygen 1) analysis of sample 3-10 and 3-11];

DETAILED DESCRIPTION OF THE INVENTION

Figure 1:
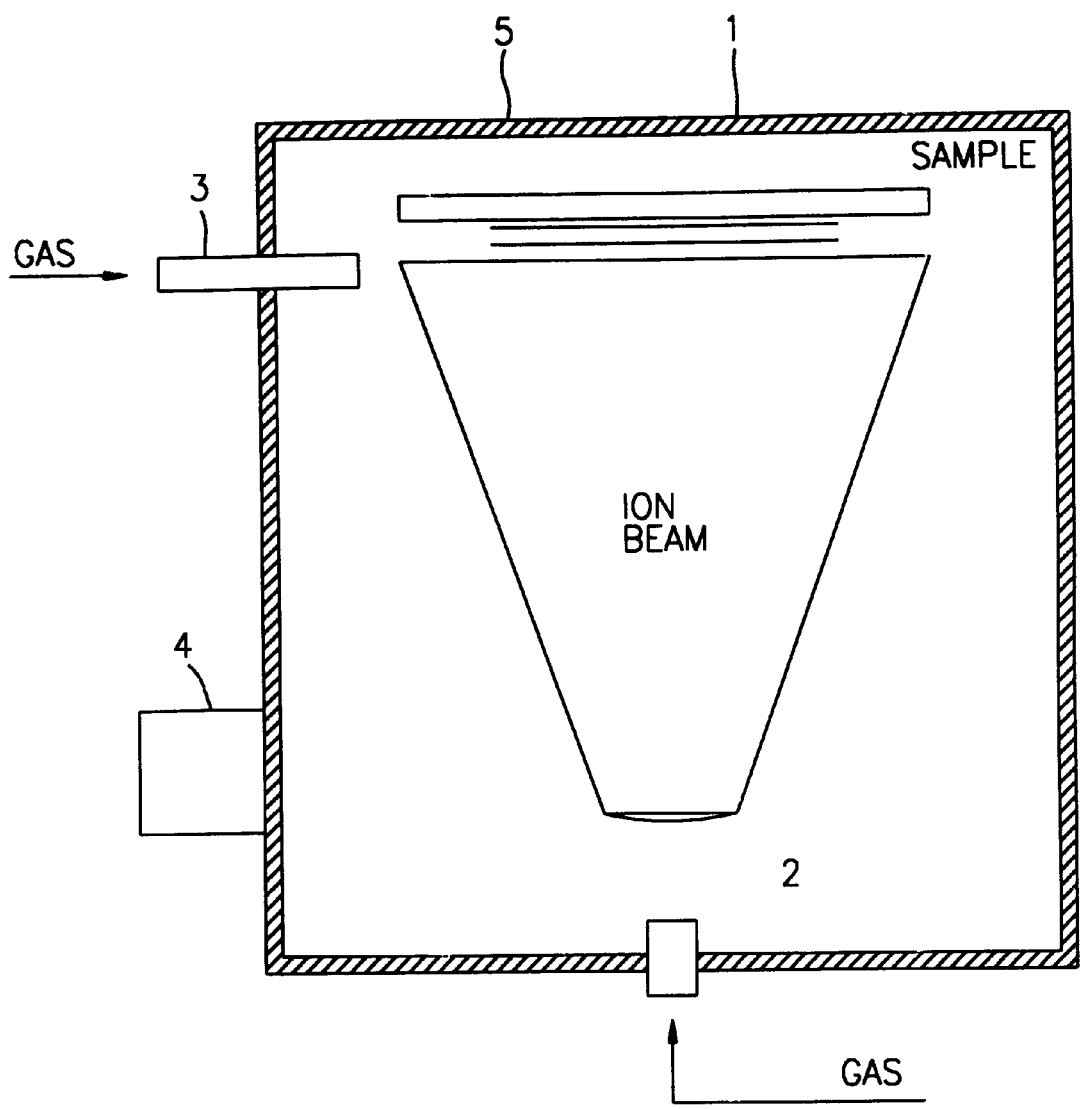
FIG. 1 is a schematic diagram of a surface treating apparatus employed in a method for modifying the surface of a polymer according to the present invention.

The, present invention will now be described in more detail with reference to the accompanying drawings.

The term "wetting angle" as used in the present application is defined as the angle formed between a line tangential to a water droplet on a surface and the plane of the surface itself on which the water drop exists. A decrease in the wetting angle means that the water droplet is spread widely and thinly onto the material surface, whereby the attraction property of the surface to water, that is to say, hydrophilicity, increases. The wetting angle is measured by measuring the angle formed between the tangential line and the polymer surface using an ERMA Contact Anglemeter via a microscope after dropping 0.025 ml of three-times distilled water at four different positions on the polymer surface, and determined from a mean value of the measured values at the four positions.

Modification of the polymer surface

First, the present invention relates to a process for modifying a polymer surface by irradiating energized ion particles onto the polymer surface while blowing a reactive gas directly over the polymer surface, to change a wetting angle and increase an adhesive strength of the polymer surface.

When energized ion particles are irradiated onto a polymer surface under certain conditions according to the process of the present invention, the chemical bonds such as carbon-carbon, carbon-hydrogen, and carbon-oxygen, etc. existing in the polymer are broken by the collision of incident energetic ion particles therewith and the bonding sites become activated. Subsequently, these activated sites react with each other or with the irradiated ion particles, or with the reactive gas or gases such oxygen, nitrogen, etc. which are directly blown onto the polymer surface so that the activated groups and reactive gas or gases combine to form hydrophilic groups on the polymer surface.

The formation of hydrophilic groups can be anticipated by measurement after irradiating ions while blowing reactive gas or gases over the polymer surface decreases, and this can be confirmed by ESCA (electron spectroscopy for chemical analysis). In ESCA, the increase in peaks of hydrophilic functional groups for the polymer irradiated in a gas or gases environment compared with that for a non-irradiated one proves that hydrophilic groups are developed on the polymer surface by the irradiation treatment.

In the present invention, a decrease in the wetting angle corresponds to the formation of hydrophilic groups on the polymer surface, and the formation of hydrophilic groups would indicate a decrease in the wetting angle. In other words, when energized ion particles are irradiated onto a polymer surface as mentioned above, the molecular polymer chains on the polymer surface are cleaved and the irradiated energized ion particles continuously proceed to produce the chain cleavage until the particles lose all their energy. In the portions of the chain which have been cleaved, i.e., activated positions, the reactive gas or gases blown around the polymer can react via a reaction path thereof to form hydrophilic groups such as carbonyl, ester, hydroxyl, carboxyl, amino, nitro, etc. Accordingly, according to the process of the present invention, the material surface can be modified to have a hydrophilic or hydrophobic property.

Any polymer comprising bonds of carbon, oxygen, nitrogen, fluorine, silicon, or the like can be used in applying the process for modifying the polymer surface according to the present invention.

As specific examples of such a polymer, polycarbonate (PC), polymethyl methacrylate (PMMA), silicon rubber, polyimide (PI), Teflon (R) (PTFE), polyvinylidene fluoride (PVDF), polyethylene terephthalate (PET), polyethylene (PE), or the like can be used.

According to the process for modifying the polymer surface of the present invention, the irradiation amount of energized ion particles is $10^{14}$–$5 \times 10^{17}$ ions/cm$^2$, and the energy of the ion particles is 0.5 keV–2.5 keV, preferably about 1 keV. In particular, the energy and fluency of ion particles varies depending on the type of metal. If the irradiation amount of energized ion particles exceeds a certain range, desirable damage to the metal surface, such as sputtering effects, in which portions of the metal surface are separated, undesirable cleavage of polymer chains, and other undesired effects may occur.

The ion beam can be obtained by introducing particles including atoms, molecules and gases to be ionized into an ion gun. As for the ion gun, a Cold Hollowed Cathode, Kaufman type, high frequency type, etc. can be used. Any gas which can be ionized, such as argon, oxygen, helium, xenon, krypton, air (a mixed gas of oxygen and nitrogen), or any mixed gas thereof can be used. By applying voltage to the ion beam, the ion particles obtain energy, as described above. By adjusting the current of the ion beam, the irradiation amount of ion particles can be controlled. The current of the ion beam can be controlled according to the discharge current, discharge voltage, acceleration potential, or the like.

When the ion particles are introduced, the pressure in the vacuum chamber increases from the original vacuum condition of $10^{-5}$–$10^{-6}$ torr to $10^{-3}$ to $5 \times 10^{-4}$ torr, and is maintained thereafter. The above described vacuum condition is appropriately set for generating energized particles. In general, in the case of a low vacuum, if the pressure inside the vacuum chamber becomes too high, arc discharge occurs because of the high voltage (0.5–2.5 keV) applied to the ion beams, and ion particles from the ion beams collide with other residual gas particles to hinder the gas ions from proceeding beyond a certain distance before they reach the material surface to be treated, whereby the generated ions cannot effectively reach the treatment surface. In this case, the distance from the ion gun to the treatment surface must be decreased to ensure that the ion particles reach the metal surface.

According to another embodiment of the present invention, the reactive gas or gases is/are suitable gases which can prepare hydrophilic functional groups, for example, oxygen, hydrogen, nitrogen, carbon monoxide, ammonia, and any mixed gas thereof, etc. The reaction degree or electronegativity of the reactive gas or gases are closely related to the change of the wetting angle.

The introduced amount of these reactive gas or gases is limited in the range of 1–8 ml/min, in order to maintain the proper pressure for plasma generation within the vacuum chamber and to allow a sufficient amount of reactive gas required for the formation of hydrophilic groups. For introducing the reactive gas or gases, it is advantageous that the reactive gas is blown directly onto the material surface simultaneously with the process of irradiating energized particles onto the metal surface.

According to another embodiment of the present invention, when energized ion particles are irradiated onto the metal surface in an ion beam current density of 1–30 $\mu$A/cm$^2$, the irradiation distance is determined depending on the vacuum degree, and the distance is preferably 25 cm or less at a low vacuum of $5 \times 10^{-3}$ torr or less, 25–55 cm at a high vacuum of $5 \times 10^{-3}$ torr–$1 \times 10^{-6}$, and a distance of 55 cm or more at an ultra high vacuum of $10^{-6}$ torr or more can be achieved. When the energized particles reach the material surface to be modified, the required "mean free path" of the ion particles will vary depending on the degree of pressure in the vacuum. Thus, the distance defined above is achieved according to each range of vacuum degree. The irradiation distance can be properly adjusted because the energy of the ion particles is as low as 0.5–2.5 keV, as described above.

Figure 19A:
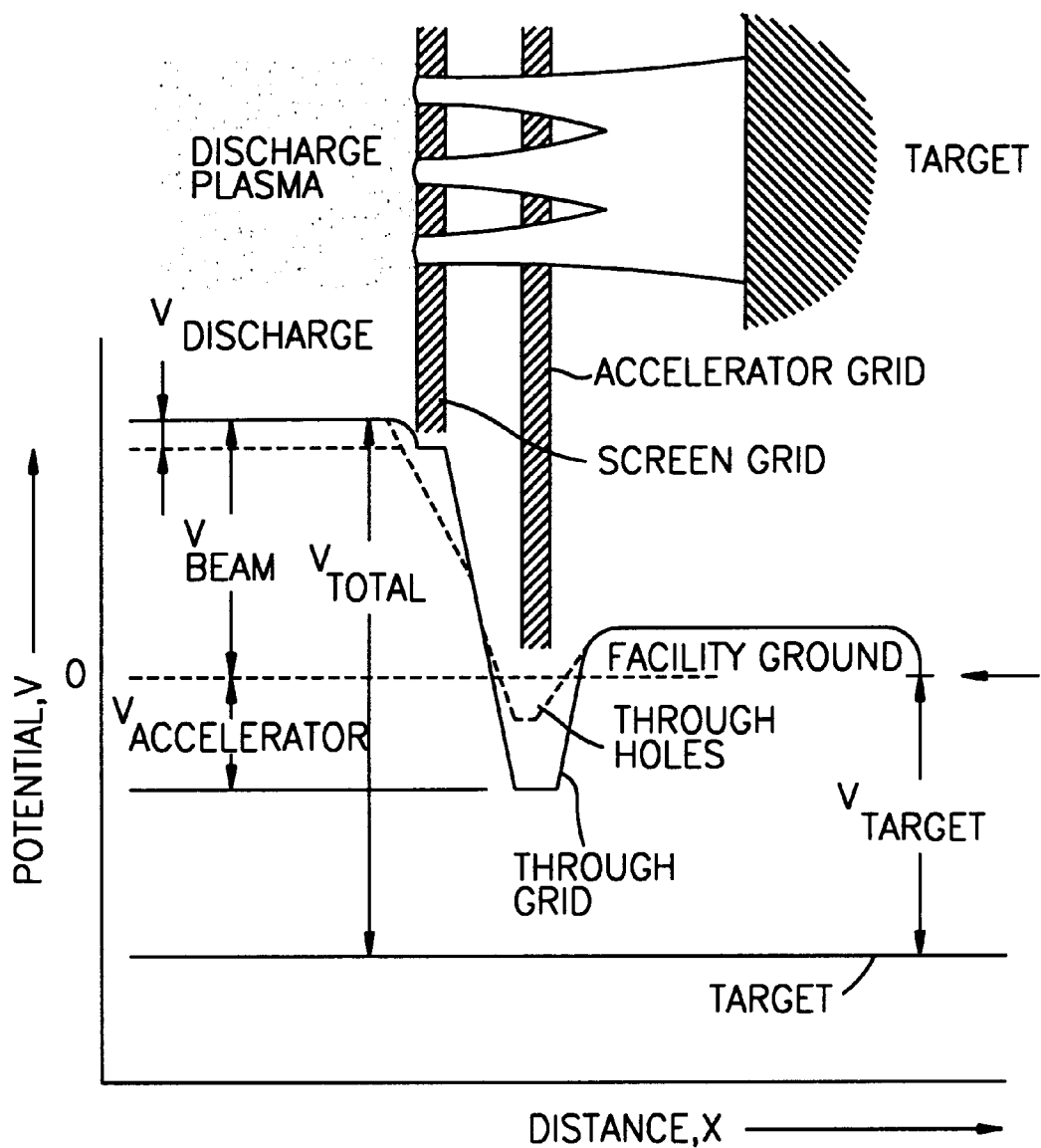
FIGS. 19A is a view showing a power source device in the apparatus employed in the process for modifying the material surfaces according to the present invention and FIG. 19B a view showing a power source device in the apparatus employed in the process for modifying the material surface according to the conventional art.
Figure 19B:
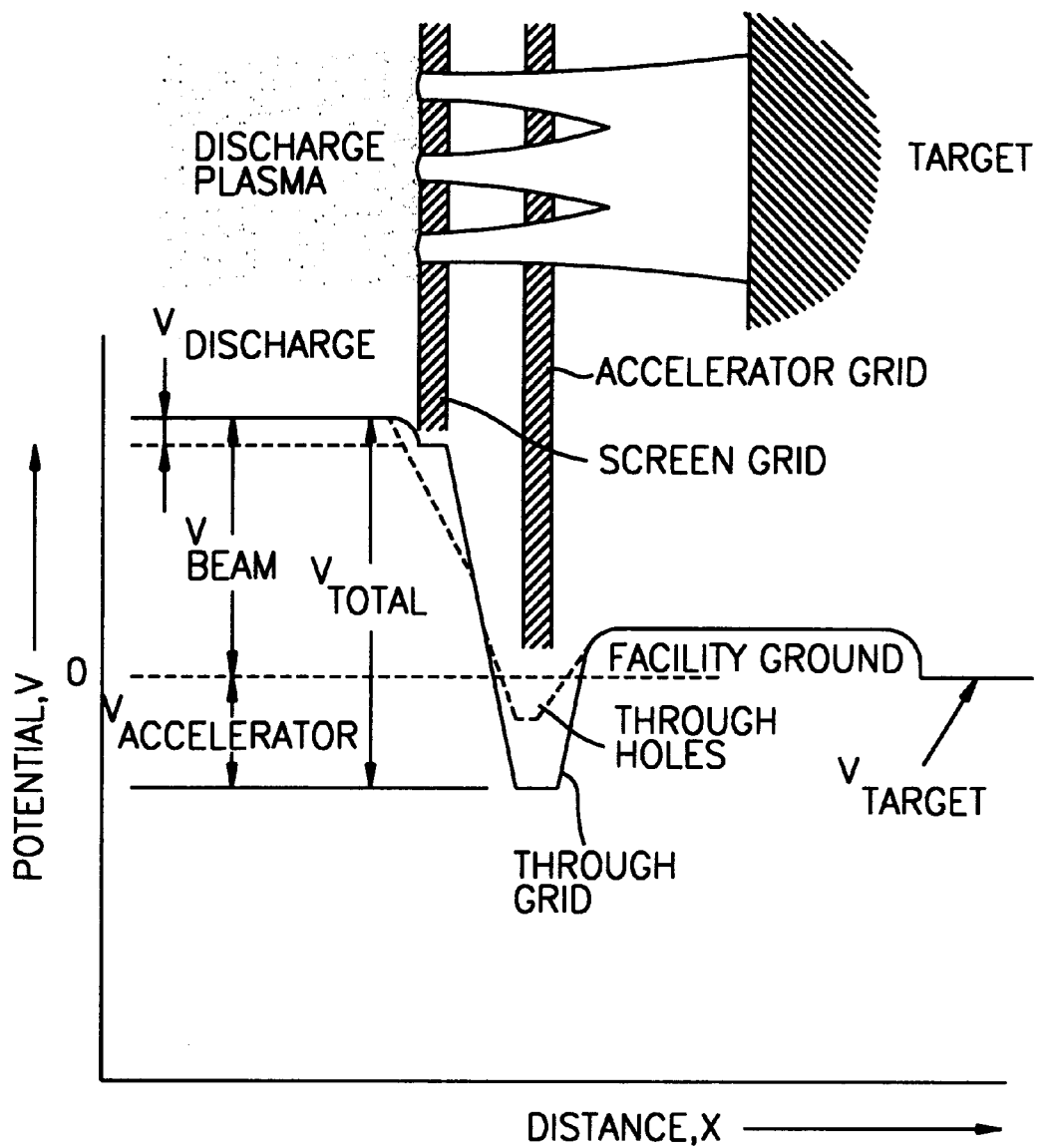
Figure 20A:
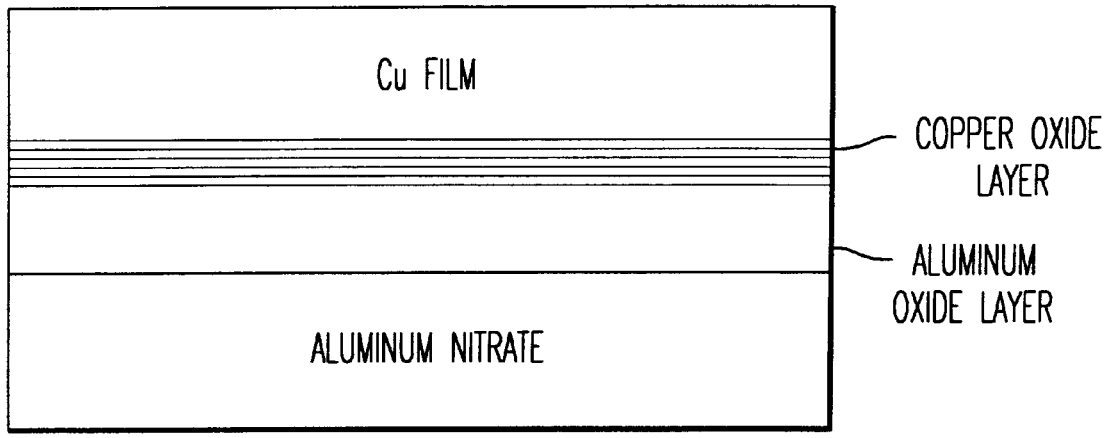
FIG. 20A is a schematic diagram showing a direct bond between a copper and an aluminum nitride the surface of which is oxidized by a conventional high temperature heating and FIG. 20B is a schematic diagram showing the direct bond between a copper and the aluminum nitride after the aluminum nitride the surface of which is modified according to the present invention is oxidized at a room temperature.
Figure 20B:
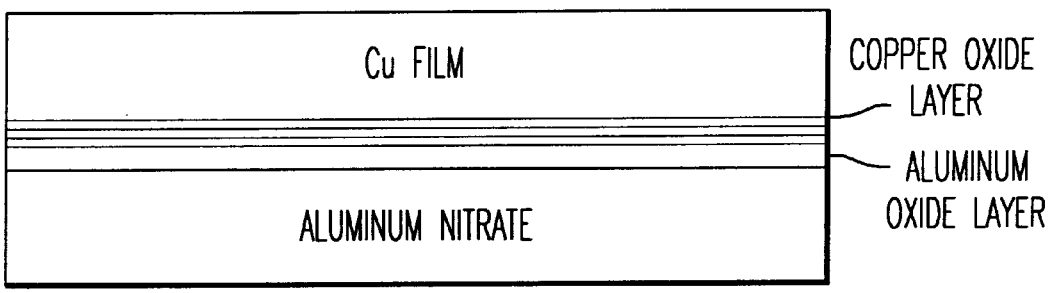
Figure 21:
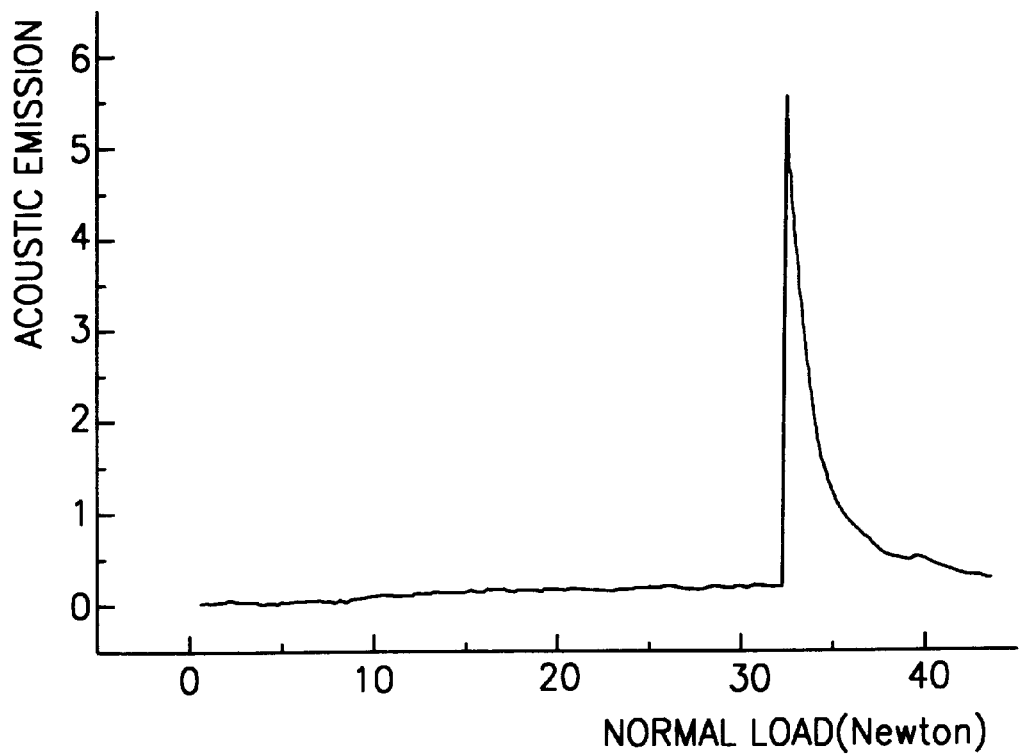
FIG. 21 is a graph showing the result of a scratch test of a test piece in which a thin copper film is applied on the surface of the aluminum nitride which is treated according to the present invention (argon ion dose: $1\times10^{16}$ per unit area, oxygen flow rate: 4 ml/min)

The device used in the process for modifying polymer surfaces according to the present invention, as shown in FIG. 1, consists of an ion gun for generating energized ion particles, connected to an electric power source (not illustrated), a sample fixing holder 5 positioned toward the gun, a reactive gas inlet 3 provided with a regulating unit for introducing an appropriate amount of gas in order to generate reactive functional groups on the sample surface, and a vacuum chamber 1 enclosing the above elements. In the vacuum chamber 1, a vacuum gauge 4 is provided to allow constant monitoring of vacuum conditions in the chamber 1. in the apparatus capable of being adopted in the present invention, as shown in FIG. 19, so as to apply higher voltage to the electric power source, a bias voltage is directed to being applied to a target. By applying a negative charge to the sample, ions can be uniformly irradiated onto the surface of materials having a primarily three-dimensional surface configuration topography as well as materials having primarily a two-dimensional topography, resulting in modifying even uneven surfaces.

According to the process for modifying the material surface of the present invention, while maintaining the material the surface of which is to be modified to have a '0' volts ground potential, ion particles taking on a positive voltage charge can be irradiated onto the surface of the material, and a negative voltage is applied to the material the surface of which is to be modified and ion particles taking on a positive voltage charge can be irradiated onto the surface of the material. The process, particularly, can modify the surface of a material having a three dimensional topography evenly.

The process for modifying polymer surfaces using the present device specifically include the following steps:

1. To make the surface of the material clean, the surface of the material is washed with soap and water, an organic solvent (methanol, isopropyl alcohol) or the like which effectively cleans but does not scratch the surface. Alternatively, surface impurities can be removed by irradiating energized particles thereonto.

2. If required, the polymer is stored overnight in a drying oven at a temperature of 100° C. so as to eliminate material absorbed thereon.

3. The cleansed surface of the polymer is then placed in the vacuum chamber 1, in which a vacuum is maintained at a pressure $10_{-4}$–$10^{-6}$ torr monitored by the vacuum gauge 4.

4. A reactive gas is introduced around the polymer by means of gas let 3 while varying the introduced amount of reactive gas within 1–8 ml/min.

5. Energized particles are generated by introducing working gas into the ion gun 2. Here, the electric power source (not illustrated) connected to the ion gun is appropriately adjusted to make the particles have an energy of 0.5–2.5 KeV.

6. The energized particles are irradiated onto the polymer surface in an irradiation amount of $10^{14}$–$5 \times 10^{17}$ ions/cm$^2$ by varying the ion beam current.

The wetting angle of PMMA modified according to the present invention decreases down to 8°, and that of PC decreases down to 12°. In the case of PI, the wetting angle of the polymer surface decreased so significantly that water droplets dropped onto the polymer surface flowed continuously and the wetting angle could not be measured.

Thus, according to the process for modifying polymer surfaces of the present invention, hydrophilic groups are formed on the polymer surface to considerably reduce the wetting angle with water, whereby the process can be widely used in various fields of application of polymers because it provides the effects of increasing or spreading of aqueous dyestuffs, increasing adhesive strength with other materials and inhibition of light scattering. In particular, in case that the polymer materials are used in preparing a reflective mirror, a mirror comprised of metal foil and thusly treated transparent polymer materials possesses a very clean surface and has excellent adhesive strength. Further, if other materials are coated by a wet method on generating hydrophilic functional groups, a very smooth and wet coating can be obtained, and this is quite an improvement over the conventional uneven coating obtained by the conventional method. Because the formation of a hydrophilic surface is very important in the field of medical polymers, the process according to the present invention is also useful in the preparation of polymers for medical use.

Further, in the polymer material treated according to the surface modification method of the present invention, changes in surface roughness are not so great that the capacity of information stored per unit area of an optical memory device is not limited by surface roughness and therefore significantly less decrease in memory capacity can be expected when a polymer modified according to the present invention is applied to optical memory device applications.

Surface modification of nitride

A process for modifying the surface of an aluminum nitride includes irradiating argon and oxygen ion beams on the surface of the aluminum nitride under an oxygen air current under a vacuum condition, and an aluminum nitride for a direct bond copper (DBC) can be obtained by forming a thin copper film on the nitride resulting from the process.

Generally, a high thermal conductivity, a low dielectricity, a high reliability, and a fitness and a chemical stability of a heat expansion coefficient among silicon chips are required to be used as a material for a circuit substrate, and an alumina material has been widely used as a material satisfying those requirements. However, to easily emit heat generated by a high density circuit, an aluminum nitride (AlN:150–300 W/mK) the heat conductivity of which is excellent compared with an alumina has been adopted.

The aluminum nitride has a wide application range since an insulating quality and a heat conductivity are excellent. A film-thickening method, a film-thinning method and a direct bond copper (DEC) method are employed to form a conductive body, and since the adoption of the film-thinning method and the DBC method does not allow copper to be bonded easily, an oxide layer is formed and a thin copper film is bonded to the oxide layer.

The aluminum nitride is adopted to devices which emit much heat such as a high-speed circuit, a logic circuit and a high power semiconductor, and has been drawing much attention as a material which has an excellent heat emission to achieve a high reliability. Beo and SiC having BeO added in a boundary surface of the particles have been commercialized as a high electric heating material, but the powder BeO and SiC is highly poisonous to the human body, due to which there is a limit on a real application, resulting in a limited adoption to military and other specific uses. The aluminum nitride for the DEC is mainly employed in an application of a high output circuit such as a high speed switching module, a microwave output amplifier, a photoelectric integrated circuit and an output supply module. Here, the bonding technique between copper and aluminum nitride plays an important role.

An alumina for DBC can achieve a strong bonding by generating eutectic compounds by precisely controlling a fixed variable number. Generally, the existence of nitrogen ions on the surface of the nitride make it difficult to be directly bonded to copper. Accordingly, a high bond strength can be obtained by forming an intermediate oxide layer on the boundary surface. Generally, a thermal oxidation method is used to obtain a high bond strength whereby a nitride aluminum substrate is heated in air or under a neutral atmosphere partially having an oxygen atmosphere at a temperature of 1000–1200° C. to form an oxide layer to have a thickness of about 1–6 $\mu$m on the substrate and the resultant is bonded on the copper platen. Here, a direct bond between the aluminum and the copper is performed in four regions of Cu/CuO$_2$/Al$_2$O$_3$/AlN. What is most important is that an oxide layer must exist between the aluminum and the copper, and a high bond strength results from the existence of CuO$_2$.

An example of a thermal heating is disclosed in European Patent No.516819, wherein the aluminum nitride substrate is maintained in a mixture gas (nitrogen:oxygen=10:1–4:1) humidified at a temperature of 1200° C. for ten to thirty minutes to form an alumina oxide layer to have a thickness of 1–4 microns and an eutectic point of copper and copper oxide, thereby resulting in achieving a high bond strength.

U.S. Pat. No. 5,150,830 describes that an oxide layer is formed under a dry atmosphere to form a stable eutectic compound on the boundary surface.

In Japanese Patent No. 3103370, the surface of the aluminum nitride is modified by a pitch and heated at over 800° C. under a neutral gas atmosphere including 5% oxygen to form an oxide layer, and then the copper film is heated up to 1083° C. under a neutral atmosphere to be directly bonded.

European Patent No. 577484 describes that an oxygen gas is provided and treated for three seconds using a pulsed excimer YAG or a CO$_2$ laser beam having a diameter of 0.5–10 mm, and thereby AlN, SiC, and BN are oxidized in a short time to perform DEC.

In U.S. Pat. No. 5,280,850, to obtain a DBC, the aluminum nitride substrate is thermally treated under a neutral atmosphere including oxygen of 100–1000 ppm, thereby to form an oxide layer of 0.1–5 micron and then heated at a temperature of less than a copper melting temperature in a sub eutectic region of Cu-CuO. Using the above-described method, a high bond strength to copper can be obtained to be applied to a substrate having a high reliability.

However, since the heating process for forming an oxide layer is complicated in the thermal oxidation, the precise controlling of the temperature and time must be carried out in the heating process to control the thickness and phase of the oxide layer, resulting in a high process ratio and a high defect rate. In the case of an external oxidation, minute pores exist on an oxide layer, and fine cracking is generated due to the difference in the thermal expansion, resulting in lowering a bond strength.

According to the thermal oxidation, since all the surfaces of the aluminum nitride substrate are oxidized, an aluminum oxide lowering a thermal conductivity is unnecessarily formed on all the surfaces.

Generally, to increase a bond strength, the boundary surfaces are required to have a continuous structure, a heat expansion coefficient is required to be well adjusted and thermodynamically stable boundary surfaces are required. Further, bond strength is increased in the case of an internal oxidation when oxygen is diffused into the material to have a continuous structure.

Accordingly, to solve the problems of the conventional art and obtain the aluminum nitride having the above characteristic of the boundary surface, an oxide layer having a homogeneous, thin and continuous structure must be formed on the surface of the aluminum nitride at room temperature.

The present invention provides a solution to the conventional problems, that is, a process for modifying the surfaces so that the surface of nitride can have an amenable boundary surface quality, a nitride having surfaces modified by such process, and a DBC nitride using the nitride.

The process for modifying the nitride surface according to the present invention can be performed at an ordinary temperature to form thin and uniform oxide layer, and as a result, the surface-modified nitride of the present invention has a remarkably improved bond strength to the thin copper film. Accordingly, the thickness of the product is formed to be as thin as possible to simplify the process, instead of forming a boundary surface layer to increase the bond on the boundary surface as the element devices have been becoming lighter, thinner, simpler, and smaller recently.

The process for modifying the surface of the nitride according to the present invention includes forming an oxide layer on the surface of a substrate by blowing a reactive gas onto the surface of the substrate when ion particles having a low energy of 3.0 KeV are irradiated to have a predetermined concentration, and depositing a thin copper film on the resultant surface to achieve a high bond strength with the thin copper film.

The process for modifying the surface by irradiating accelerated ion beams on the material surface can enhance the mechanical strength, wettability, abrasion resistance, and reactivity with a gas by controlling the surface structure or bond density, which is a factor that the present invention is drawing attention. An ion beam having a high energy of 10-100 kev has been generally used so far, which has resulted in many defects on the surface and a composition change when the high energy ion beam is used. Further, the magnitude of beams is limited and a uniformity and a beam current is difficult to increase.

A low energy of a few keV is higher than the bond energy of a solid, and a wide and uniform beam can be obtained due to the energy. Since using such an ion beam can modify the surface, for minimizing the defects in the surface, in the present invention, the ions of argon, oxygen, nitrogen or air gas having a relatively lower energy of about 0.5–3 keV, are irradiated onto the surface of the nitride and then onto the activated surface a predetermined amount of oxygen is provided to form a thin oxide layer, resulting in minimizing a remaining condensation and increasing a bond strength with respect to a metal material such as copper.

As described above, when the aluminum nitride substrate passes through a thermal oxidation during heating, an oxide layer is formed on all the surfaces thereof, and as a result, an aluminum oxide layer having a very low heat conductivity exists partially, and a minimum surface oxide layer thickness must amenably exist to maximize the degree of heat conductivity.

According to the process of the present invention, an oxide layer can be selectively formed only on the surface where a thin copper film is to be formed, to maximize the heat conductivity.

The aluminum nitride employed in the present invention is a wafer the surface of which is polished to be very smooth and on which a surface oxide layer exists at room temperature, but since such oxide layer is a non-amorphous oxide film which is thermodynamically unstable, although a heterogeneous material such as a metal is bonded thereon, it does not help obtain a sufficient degree of bond strength.

In an external oxidation, a very thin oxide layer (<100 nm) is formed on the surface and the oxygen is not connected to the aluminum nitride matrix, which makes it difficult to play an important role in increasing a bond strength. To increase a bond strength, a surface oxide layer must be amenably formed by an internal oxidation. To cause an internal oxidation to occur at a low temperature, residual energy is applied onto the surface and nitrogen atoms bonded therein are required to be separated from their bond with the aluminum ions.

The conventional process for modifying the surface of a solid employing beams having a high energy of hundreds of kev to MeV afflicts many defects and much damage on the surface of the solid, due to which it is difficult to perform a uniform treatment on a boundary surface having a minute construction, but, according to the present invention, low energy beams which were used for eliminating impurities absorbed physically and chemically on the surface of the solid are irradiated onto the surface of the material, and then a reactive gas at 2–7 ml per minute is provided on the surface thereby to form a thin and uniform oxide layer.

The direct bond between the aluminum nitride and copper according to the present invention will now be described in more detail.

1. The surface of the aluminum nitride is cleaned with soap and water and acetone and then ultrasonic cleaning is carried out thereon for ten minutes in trichloroethylene solvent to remove organic material.

2. An $Ar^+$ ion beam having an energy of 0.5~1.0 keV is irradiated onto the sample surface for one to five minutes to eliminate foreign materials absorbed chemically and physically from the surface of the sample.

3. The well cleaned aluminum nitride is put in the vacuum tube, which is maintained to have a vacuum pressure of about $10^{-5}$ torr by using a vacuum pump system.

4. A desired amount of ions are irradiated while changing a gas ion gun to have an appropriate energy between 0.5 and 3.0 keV. Here, a reactive gas is introduced on the substrate surface at an amount of 2–7 ml per minute.

5. A copper (Cu) film is formed on the aluminum nitride substrate continuously modified by a sputtering method under a vacuum condition.

The above first and second processes are not necessarily required since the purpose of the processes is to obtain a clean surface of the sample.

An appropriate irradiation amount of argon ions in the present invention is $10^{14}$–$10^{17}$ ions/cm$^2$. If the irradiation amount of the argon ions exceeds $10^{17}$ ions/cm$^2$, a sputtering speed of the nitrogen ions having an elemental weight smaller than that of aluminum ions is much larger due to the sputtering method, and as a result, a layer which is lacking in nitrogen is increased on the surface of the aluminum nitride, which makes it difficult for a uniform oxide layer to be formed on the boundary surface.

In an example of the preparation method of the present invention, argon is preferably used as a gas for an ion beam, but oxygen, nitrogen, and other inert gases can be adopted. The desired introduction amount of gases is amenably 1–10 ml/min so that the reaction of the surface can be activated and a better result can be obtained when the gas is introduced in an amount of 2–7 ml/min. A vacuum degree of the vacuum tube is initially maintained to have a pressure of $1 \times 10^{-5} \times 10^{-5}$ torr and when a gas is introduced, it is raised to about $10^{-4}$ torr.

The aluminum nitride substrate prepared by the above method does not require a separate thermal treatment and can be directly bonded with copper at room temperature. Accordingly, the substrate can be reliably employed in a high output semiconductor and as a substrate for a heat emission device.

Hereafter, the process for modifying material surfaces by using the present invention is described in more detail referring to specific examples. However, it is not intended to limit the scope of the present invention to these examples.

EXAMPLES

Example 1

(1) Surface modification for polymer PC

Commercial polymer PC was cut into 10×10×3 mm³ samples which were washed with soap and water or an organic solvent such as methanol or isopropyl alcohol. The samples were stored overnight in a drying oven with the temperature maintained at 60° to remove unwanted materials absorbed in their surface. The obtained polymer samples were placed into a vacuum chamber maintained at a pressure of $10^{-5}$–$10^{-6}$ torr and then, under the conditions described in Table 1 below, an ion generating gas and a reactive gas were introduced through an ion gun and a gas inlet, respectively, to perform surface modification. Here, the introduced amount of working gas was properly controlled to maintain the vacuum in the vacuum chamber at $1 \times 10^{-4}$ to $5 \times 10^{-4}$ torr. For surface-treated samples according to the individual conditions, their wetting angles were measured by ERMA wetting Anglemeter and Table 1 is the results illustrated in FIG. 2 (sample 1-1 and 1-2) and FIG. 3 (samples 1-3 to 1-10).

TABLE 1

| No. | IP | IE | AII | RG | ARG |
|---|---|---|---|---|---|
| 1-1 | $Ar^+$ | 0.5–1.5 | $10^{16}$ | — | — |
| 1-2 | $Ar^+$ | 0.5–1.5 | $10^{16}$ | $O_2$ | 4 |
| 1-3 | $Ar^+$ | 1 | $10^{14}$–$5 \times 10^{17}$ | — | — |
| 1-4 | $Ar^+$ | 1 | $10^{14}$–$5 \times 10^{17}$ | $O_2$ | 2 |
| 1-5 | $Ar^+$ | 1 | $10^{14}$–$5 \times 10^{17}$ | $O_2$ | 4 |
| 1-6 | $Ar^+$ | 1 | $10^{14}$–$5 \times 10^{17}$ | $O_2$ | 6 |
| 1-7 | $O_2^+$ | 1 | $10^{14}$–$5 \times 10^{17}$ | — | — |
| 1-8 | $O_2^+$ | 1 | $10^{14}$–$5 \times 10^{17}$ | $O_2$ | 4 |
| 1-9 | $Ar^+$ | 1 | $10^{14}$–$5 \times 10^{17}$ | $H_2$ | 4 |
| 1-10 | $Ar^+$ | 1 | $10^{14}$–$5 \times 10^{17}$ | $N_2$ | 4 |

*IP: Ion particles
IE: Ion energy (KeV)
RG: Reactive gas
AII: Amount of ion irradiation (ions/cm²)
ARG: Amount of reactive gas (ml/min)

Figure 2:
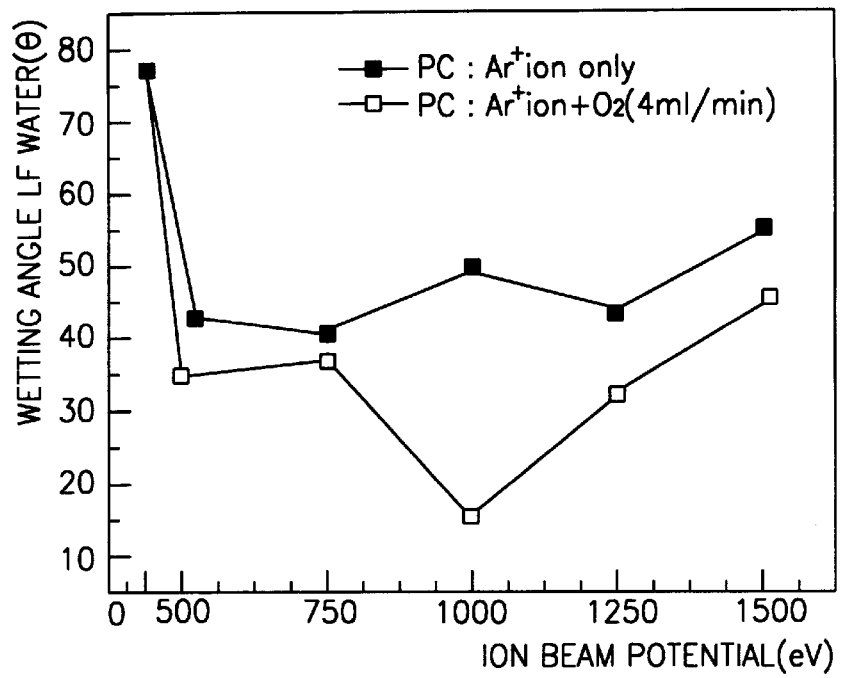
FIG. 2 is a graph showing the results of measuring the wetting angle of samples 1-1 and 1-2 according to Example 1-1.

FIG. 2 is a graph showing the results of the wetting angle change with respect to ion energy charge. When oxygen is blown around the polymer surface, it was shown that there occurs a considerable decrease in wetting angle compared to the typical wetting angle change (mainly 40–50°). Particularly, a minimum wetting angle is achieved at an ion energy of 1 KeV.

Figure 3:
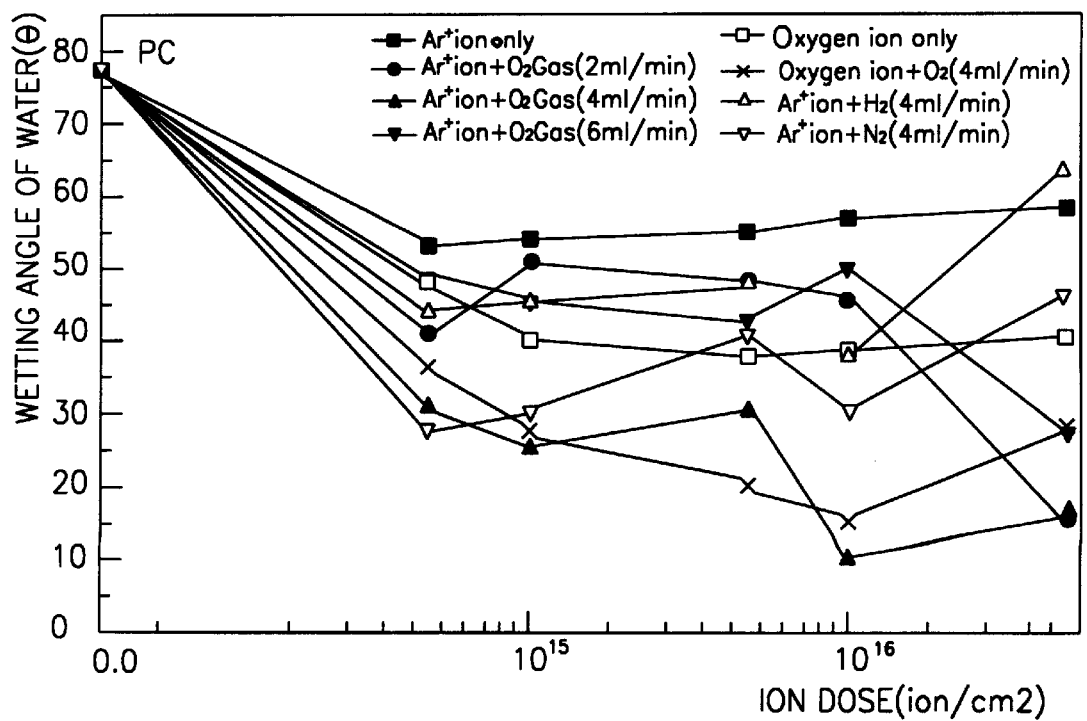
FIG. 3 is a graph showing the results of measuring the wetting angle of samples 1-3 and 1-10 according to Example 1-1.

FIG. 3 is a graph showing the result of the wetting angle change of samples 1-3 and 1-10 depending on the change of the ion irradiation at 1 KeV of ion energy. The wetting angle change of Comparative Example (1-3) in which argon ions were irradiated with no reactive gas blowing, decreased to around 50° at $5 \times 10^{14}$ $Ar^+/cm^2$ and it exhibited a wetting angle with little difference according to the increase of irradiation amount. In contrast, in Examples (1–4) according to the present invention in which argon ions were irradiated while blowing oxygen, there was totally exhibited sufficient decreasing in wetting angle according to the increasing of irradiation amount of argon ions as well as considerable decreasing in wetting angle. Particularly, minimum wetting angle (12°) appeared at an irradiation amount of $10^{16}$ $Ar^+/cm^2$.

(2) Wetting angle identifying test

Sample 1-5 (ion irradiation amount—$10^{16}$ $Ar^+/cm^2$) that was surface-treated in the above test (1) and had the highest wetting angle decrease was exposed to air and the wetting angle was measured during the course of time. Also the same sample was dipped into 1% dilute hydrochloric acid for a constant time and dried with dry nitrogen gas and then wetting angle was measured again. The results of the wetting angle measurements are illustrated in FIG. 4.

Figure 4:
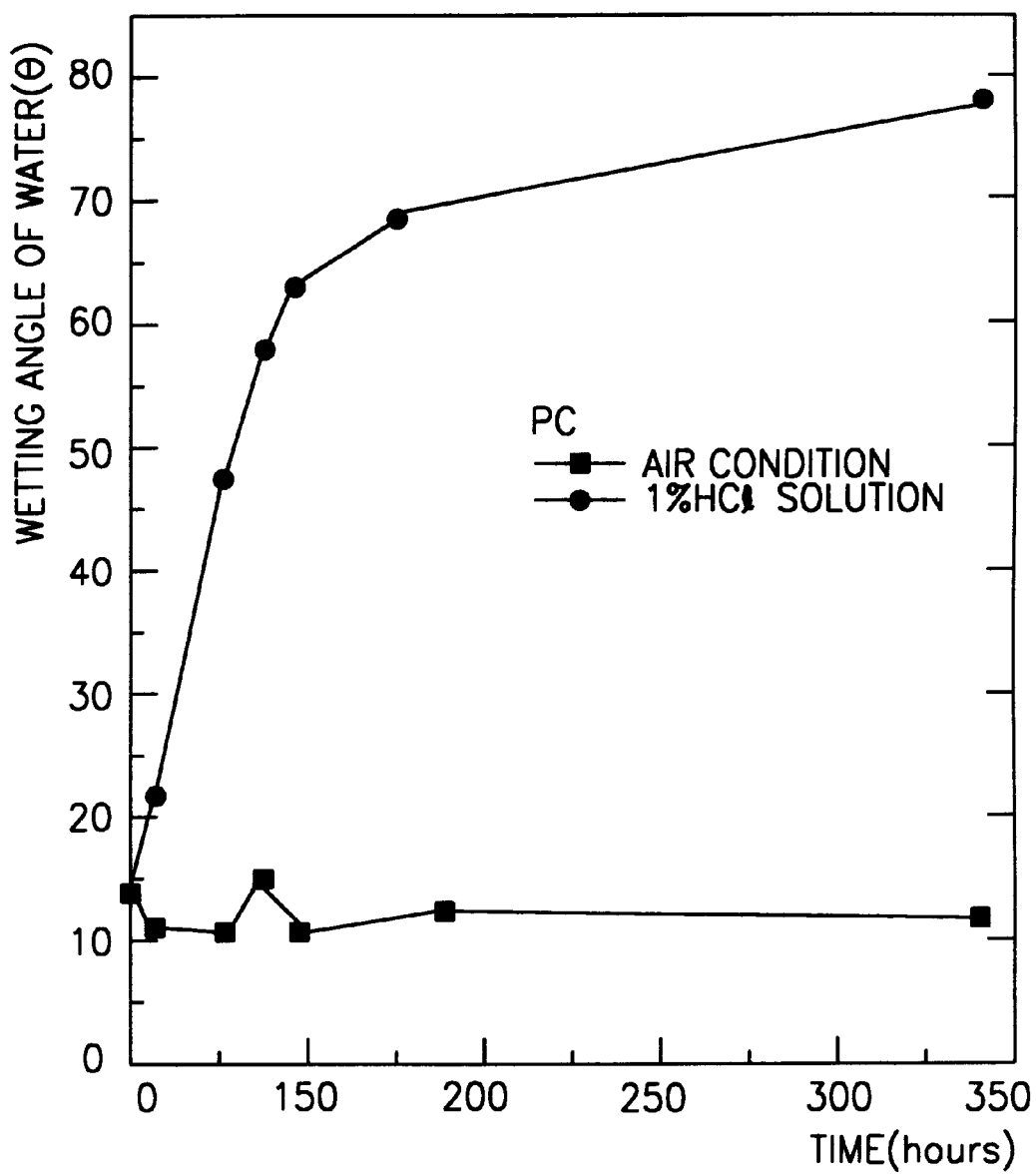
FIG. 4 is a graph showing the results of a test identifying the decrease in the wetting angle with respect to sample 1-5 (ion irradiation=$10^{16}$ ions/cm$^2$) according to Example 1-2.

As shown in FIG. 4, in the sample exposed in the air, wetting angle increased with time, but the sample dipped into 1% diluted hydrochloric acid maintained a minimum wetting angle without significant change. These results confirm that hydrophilic functional groups had formed on the surface of the polymer. Thus, for the sample exposed to air, it can be considered that hydrophilic functional groups formed on the polymer surface rotate with time, towards the direction of the polymer base having many polar functional groups. However, such rotation of the formed hydrophilic functional groups is prevented in the sample dipped into 1% diluted HCl due to the high polarity within HCl solution.

(3) Inspection test for hydrophilic functional group formation

ESCA surface analysis was performed on sample No. 1-5 (ion irradiation amount—$10^{16}$ $Ar^+/cm^2$) which is compared with a sample without irradiating ions. The results are illustrated in FIGS. 5A and 5B.

Figure 5A:
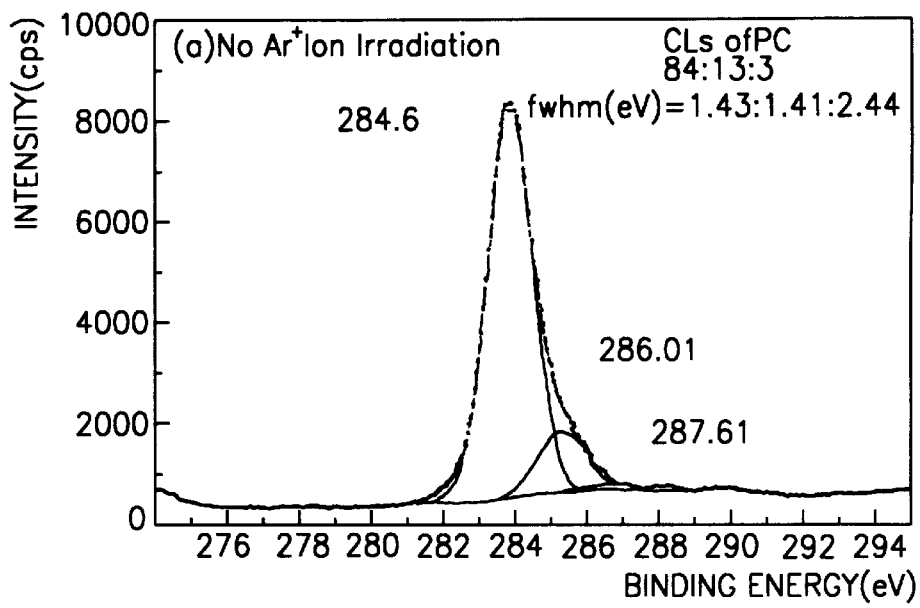
FIGS. 5A and 5B are graphs showing the results of an ESCA surface analysis of sample 1-5 (ion irradiation=$10^{16}$ ions/cm$^2$) compared to a sample which was not irradiated [FIG. 5A:results of C1 (Carbon 1) analysis of non-irradiated sample/
Figure 5B:
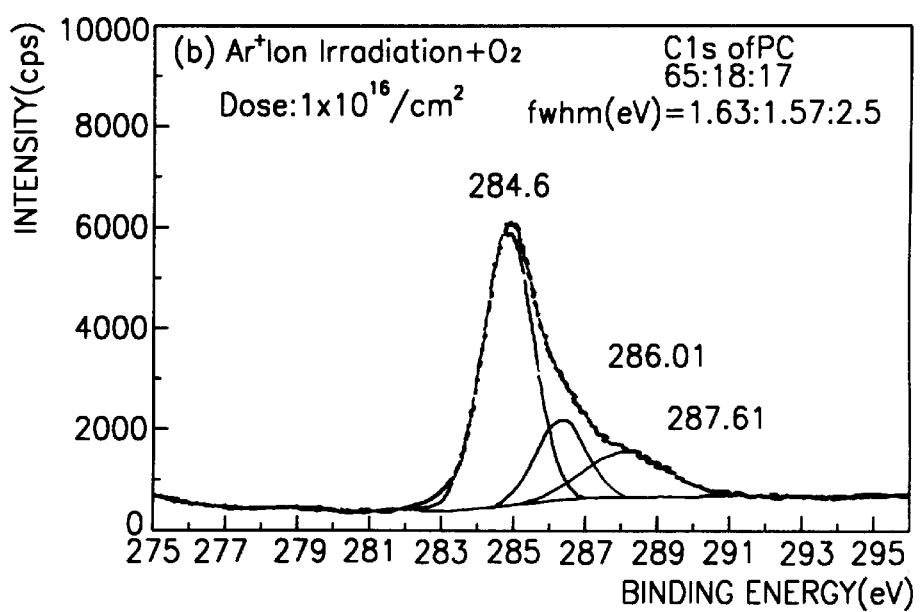

From the result of ESCA analysis with respect to carbon of FIGS. 5A and 5B, it is shown that hydrophilic functional groups were relatively formed more at 286 eV and 287.7 eV. Also, from the result of ESCA analysis with respect to oxygen, it was shown that when the polymer surface was modified according to the present invention, oxygen reacted with the surface molecules to be bound therein so that the amount of oxygen which acts to render the surface hydrophilic increased about two-fold or more.

(4) Surface roughness test

For the sample without ion irradiation and surface-treated sample 1-3 (ion irradiation amount=$5 \times 10^{16}$ ions/cm²) and 1-5 (ion irradiation amount=$5 \times 10^{16}$ ions/cm²), their surfaces were observed by atomic force microscope (AFM) and the results are illustrated in FIG. 6.

Figure 6A:
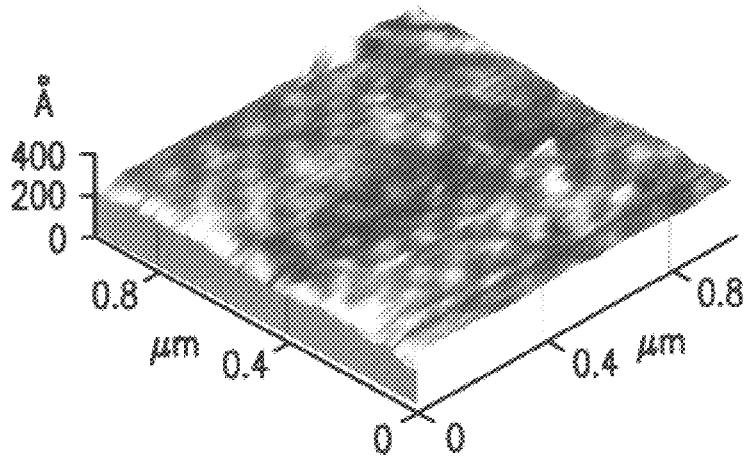
FIGS. 6A, 6B and 6C are microphotographs by AFM of samples 1-3 (ion irradiation=$5\times10^{16}$ ions/cm$^2$) and 1-5 (ion irradiation=$5\times10^{16}$ ions/cm$^2$) compared to a sample prior to surface modifying according to Example 1-4
Figure 6B:
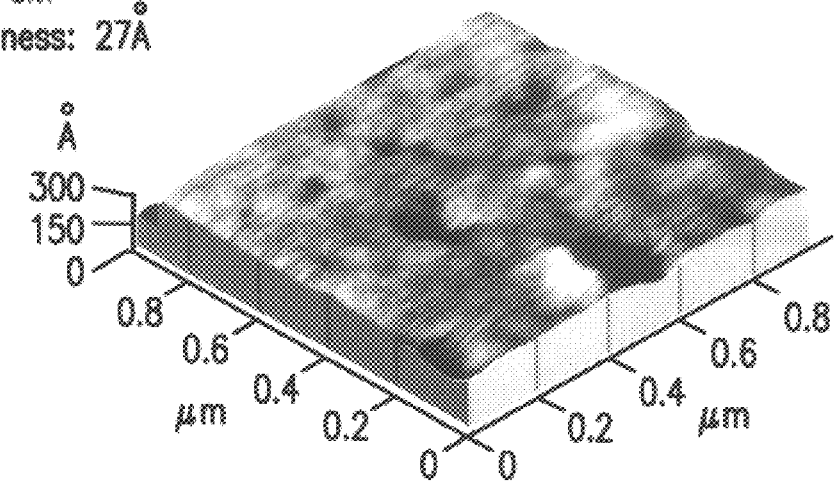
Figure 6C:
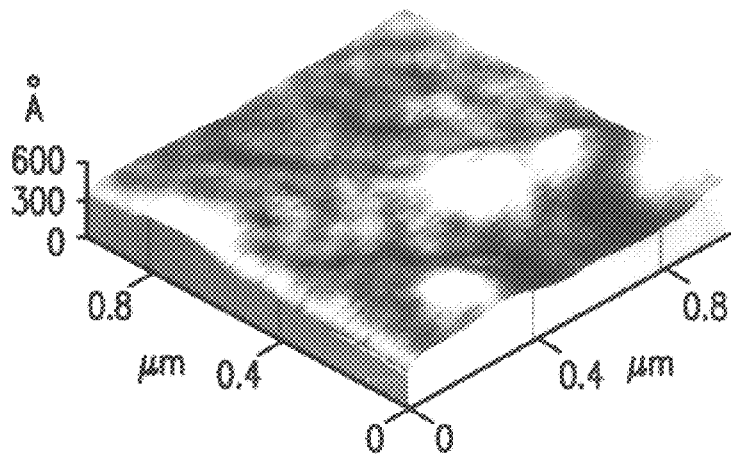

In FIG. 6, when only argon was irradiated onto the sample which had an original surface roughness of about 14 Å (refer to FIG. 6A) prior to surface modification, the surface roughness was increased to about 22–27 Å (refer to FIG. 6B), and when surface modification was performed under an oxygen atmosphere, surface roughness was found to be in the range of 26–30 Å (refer to FIG. 6C) similar to the above result. Such change in surface roughness shows considerable differences compared to the conventional surface modification method wherein surface roughness only changed mainly in units of $\mu$m.

(5) Peel-off test with Scotch (R) tape

Figure 7:
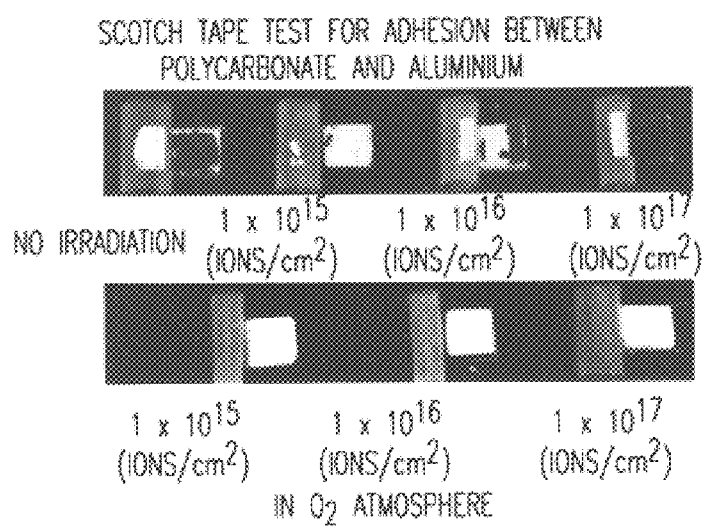
FIG. 7 is a photograph showing the results of a peel-off test with Scotch (R) tape of sample 1-5.

Aluminum was evaporated (1000 Å) onto a sample without ion irradiation and surface-modified samples 1-3 and 1-5 with ion irradiation of $10^{15}, 10^{16}$ and $10^{17}$, respectively, by thermal evaporation and then, a peel-off test with Scotch (R) tape was performed for the above samples, and the results are illustrated in FIG. 7.

In FIG. 7, it shows that when only argon ions were irradiated, the aluminum was partially or totally peeled-off with Scotch (R) tape. However, when the aluminum was deposited after surface modification under an oxygen atmosphere according to the present invention, the deposited aluminum did not peel off.

Example 2

Surface modification for polymer PMMA (1) Surface treatment

Figure 8:
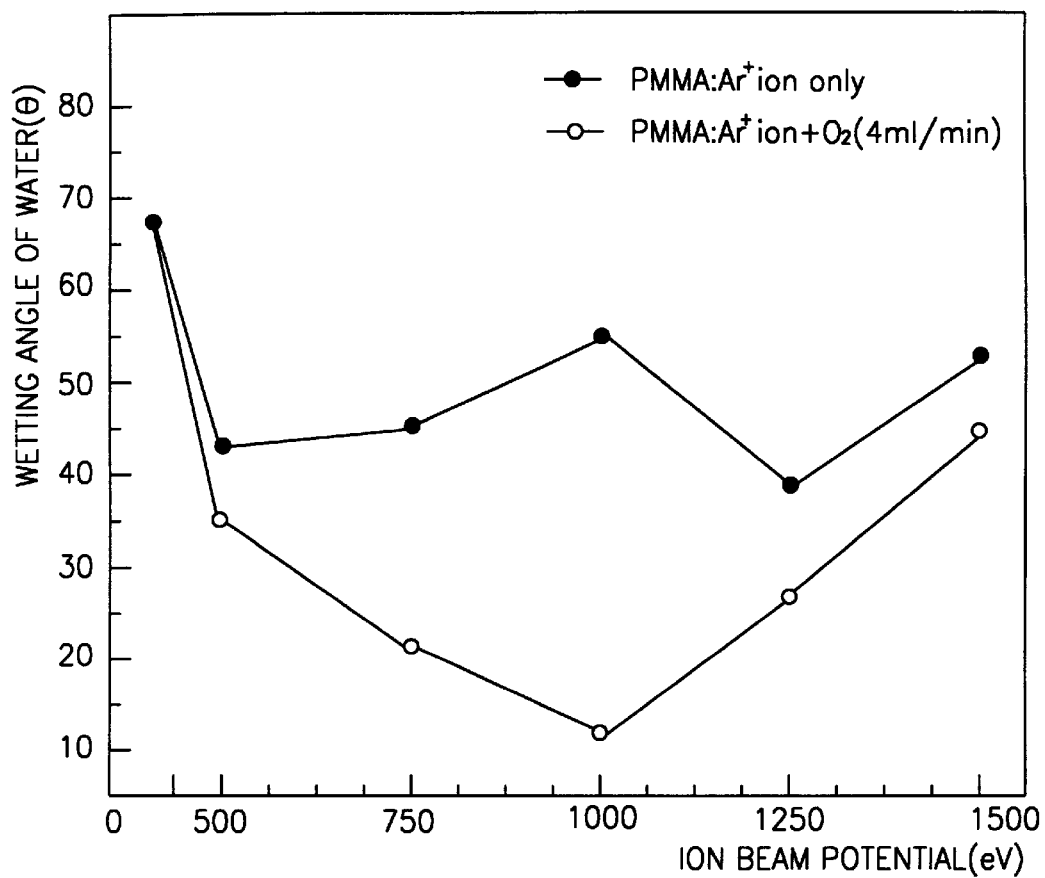
FIG. 8 is a graph showing the results of measuring the wetting angle of samples 2-1 and 2-2 according to Example 2-1.

Commercial PMMA was surface-treated in accordance with the same procedure as in Example (1-1) under the conditions described in Table 2 below, and then the wetting angle was measured, and the results are illustrated in FIG. 8 (sample 2-1 and 2-2) and FIG. 9 (sample 2-3 to 2-6).

TABLE 2

| No. | IP | IE | AII | RG | ARG |
|---|---|---|---|---|---|
| 2-1 | $Ar^+$ | 0.5–1.5 | $10^{16}$ | — | — |
| 2-2 | $Ar^+$ | 0.5–1.5 | $10^{16}$ | $O_2$ | 4 |
| 2-3 | $Ar^+$ | 1 | $10^{14}$–$5 \times 10^{17}$ | — | — |
| 2-4 | $Ar^+$ | 1 | $10^{14}$–$5 \times 10^{17}$ | $O_2$ | 4 |
| 2-5 | $O_2^+$ | 1 | $10^{14}$–$5 \times 10^{17}$ | — | — |
| 2-6 | $O_2^+$ | 1 | $10^{14}$–$5 \times 10^{17}$ | $O_2$ | 4 |

*IP: Ion particles
IE: Ion energy (KeV)
RG: Reactive gas
AII: Amount af ion irradiatian (ions/cm$^2$)
ARG: Amount of reactive gas (ml/min)

FIG. 8 is a graph illustrating the results of wetting angle change with respect to ion energy change. When oxygen was blown around the polymer surface, there was a remarkable change of the wetting angle and considerable wetting angle decreases can be observed compared to typical wetting angle decreases. Particularly, a minimum wetting angle was obtained at 1 KeV ion energy.

Figure 9:
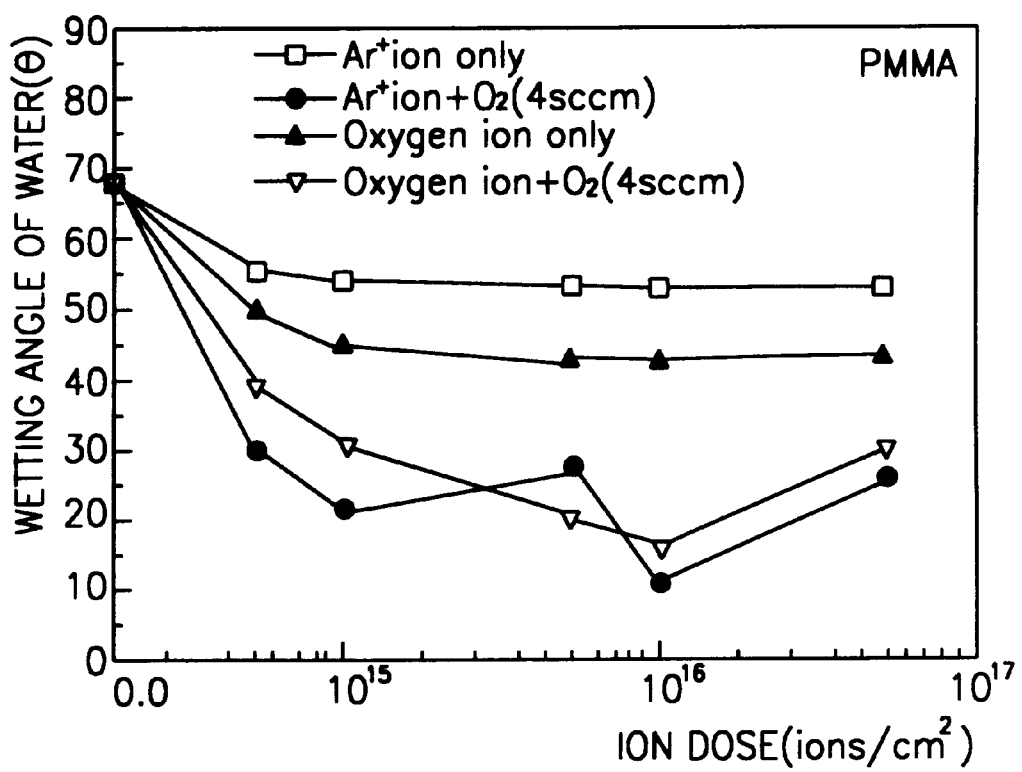
FIG. 9 is a graph showing the results of measuring the wetting angle of samples 2-3 to 2-6 according to Example 2-1.

FIG. 9 is a graph illustrating the results of wetting angle change of samples 2-3 to 2-6 according to ion irradiation change at 1 KeV ion energy. The considerable wetting angle decreases were observed when energized ion particles were irradiated while blowing oxygen around the sample and according to the increase in irradiation amount of argon ions, a significant decrease in wetting angle was observed. In particular, a minimum wetting angle of 80 was observed at irradiation of $10^{16}$ $Ar^+$ions/cm$^2$.

(2) Wetting angle identifying test

Sample 2-4 (ion irradiation amount—$10^{16}$ ions/cm$^2$) the surface of which was treated as in the above test (1), had the greatest wetting angle decrease when the sample was exposed in the air, and the wetting angle was measured over the course of time. Also the same sample was dipped into 1% dilute hydrochloric acid for a constant time, dried with dry nitrogen gas and then the wetting angle was measured. The results of the wetting angle measurements are illustrated in FIG. 10.

Figure 10:
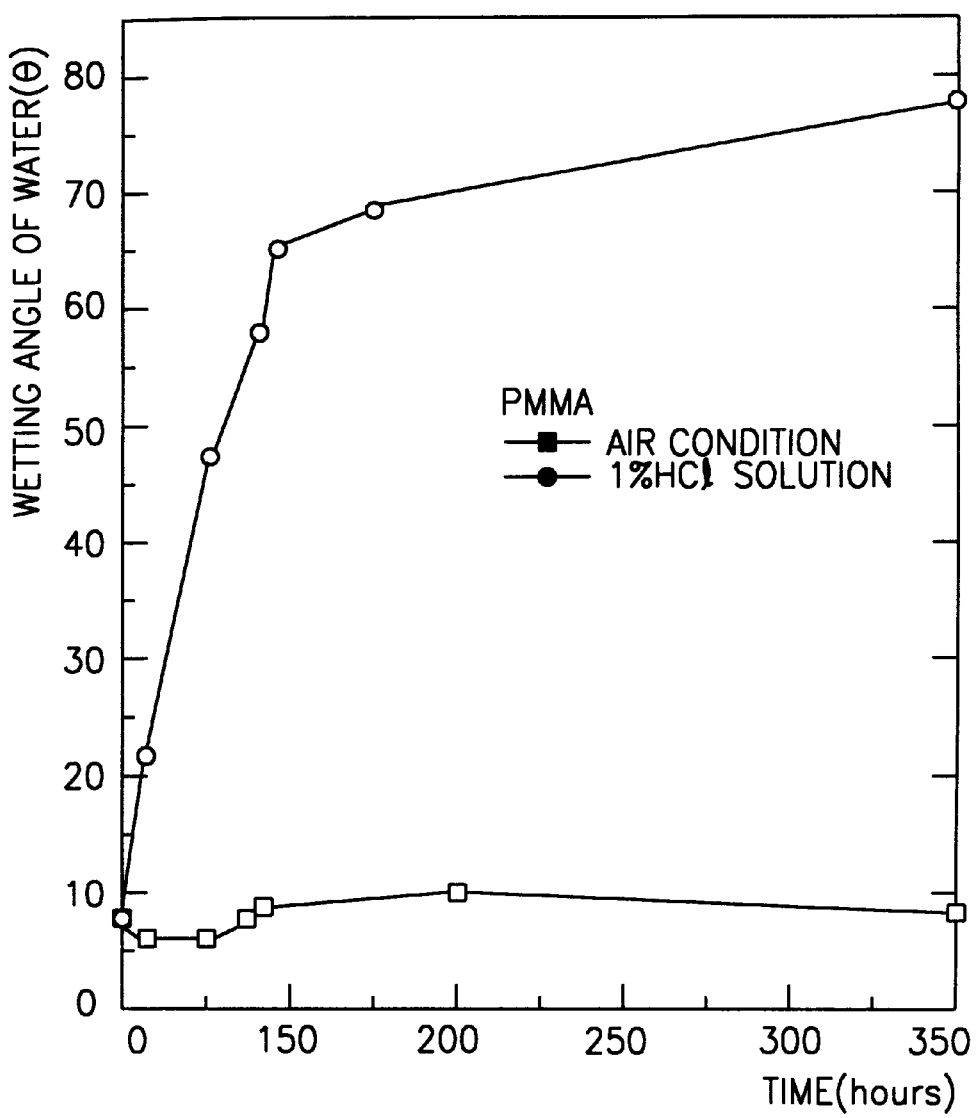
FIG. 10 is a graph showing the results of measuring the wetting angle of sample 2-4 (ion irradiation=$10^{16}$ ions/cm$^2$) according to the Example 2-2.

As shown in FIG. 10, in the sample exposed in the air, wetting angle increased with time, but the sample dipped into 1% diluted hydrochloric acid maintained a minimum wetting angle without significant changes.

Example 3

Surface modifying treatment of other polymers (1) Surface treatment

Commercial polymer PTFE, silicon rubber, PI and PET were surface-treated as in Example (1-1) under the conditions listed in Table 3 below. The results are shown in FIG. 11.

TABLE 3

| No. | KP | IP | IE | AII | RG | ARG |
|---|---|---|---|---|---|---|
| 3-1 | Teflon | $Ar^+$ | 1 | $10^{14}$–$10^{17}$ | — | — |
| 3-2 | Teflon | $Ar^+$ | 1 | $10^{14}$–$10^{17}$ | $O_2$ | 4 |
| 3-3 | SR | $Ar^+$ | 1 | $10^{14}$–$10^{17}$ | — | — |
| 3-4 | SR | $Ar^+$ | 1 | $10^{14}$–$10^{17}$ | $O_2$ | 6 |
| 3-5 | PI | $Ar^+$ | 1 | $10^{14}$–$10^{17}$ | — | — |
| 3-6 | PI | $O_2^+$ | 1 | $10^{14}$–$10^{17}$ | — | — |
| 3-7 | PI | $Ar^+$ | 1 | $10^{14}$–$10^{17}$ | $O_2$ | 4 |
| 3-8 | PI | $O_2^+$ | 1 | $10^{14}$–$10^{17}$ | $O_2$ | 4 |
| 3-9 | PI | $Air^+$ | 1 | $10^{14}$–$10^{17}$ | — | — |
| 3-10 | PET | $Ar^+$ | 1 | $10^{14}$–$10^{17}$ | — | — |
| 3-11 | PET | $Ar^+$ | 1 | $10^{14}$–$10^{17}$ | $O_2$ | 6 |
| 3-12 | PET | $Kr^+$ | 1 | $10^{14}$–$10^{17}$ | — | — |
| 3-13 | PET | $Kr^+$ | 1 | $10^{14}$–$10^{17}$ | $O_2$ | 6 |
| 3-14 | PET | $O_2$ | 1 | $10^{14}$–$10^{17}$ | — | — |
| 3-15 | PET | $Ar^+$ | 1 | $10^{14}$–$10^{17}$ | $O_2$ | 2 |
| 3-16 | PET | $Ar^+$ | 1 | $10^{14}$–$10^{17}$ | $O_2$ | 4 |

Figure 11A:
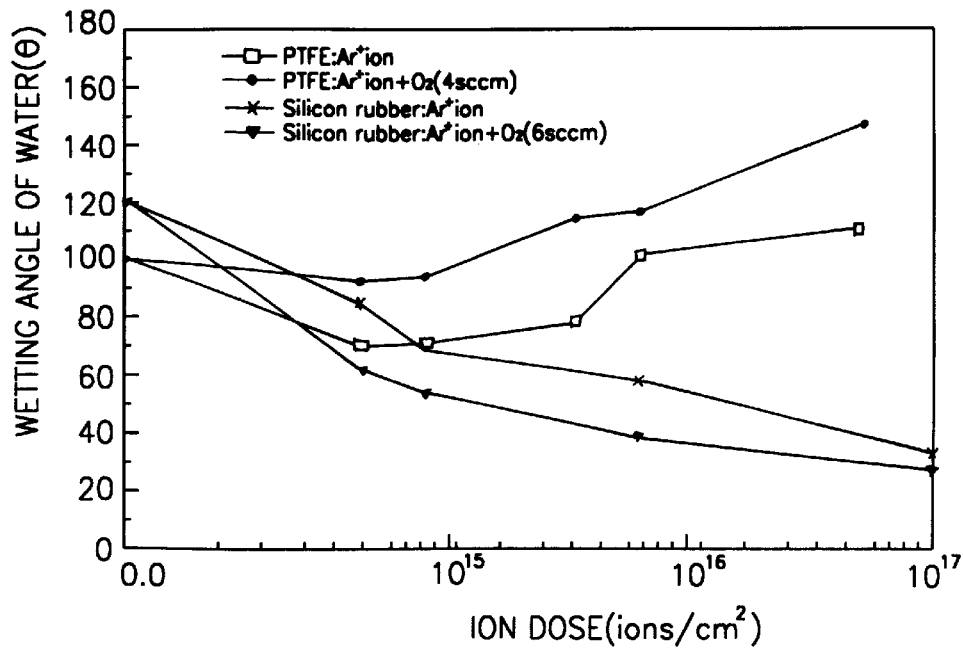
FIGS. 11A, 11B and 11C are graphs showing the result of measuring the wetting angle of samples 3-1 to 3-10 and 3-12 to 3-16
Figure 11B:
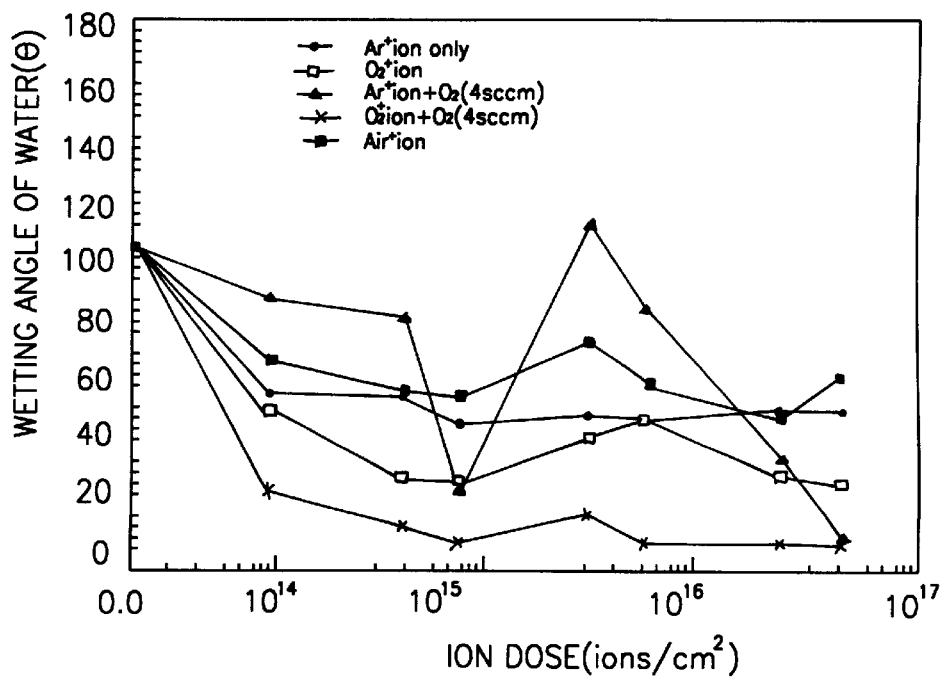
Figure 11C:
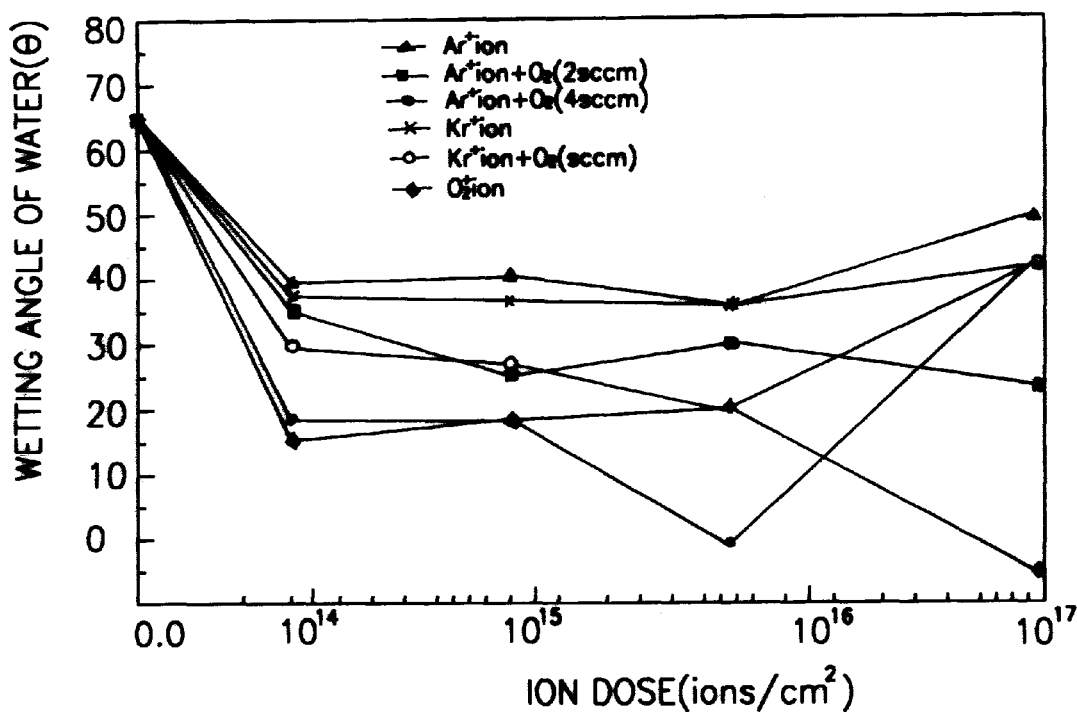

*KP: Kinds of polymers
IP: Ion particles
IE: Ion energy (KeV)
RG: Reactive gas
AII: Amount of ion irradiation (ions/cm$^2$)
ARG: Amount of reactive gas (ml/min)
SR: Silicon rubber As shown in FIGS. 11A through 11C, the results obtained in the case of irradiation while blowing reactive gas, oxygen, etc. around the samples as described above were also similar to the results in the previous experiment, and it was demonstrated that surface modifying treatment using any energized ion particles ($Air^+$, $Kr^+$, $O_2^+$ etc.), not limited to argon ions, can be applied to all polymers.

Figure 12A:
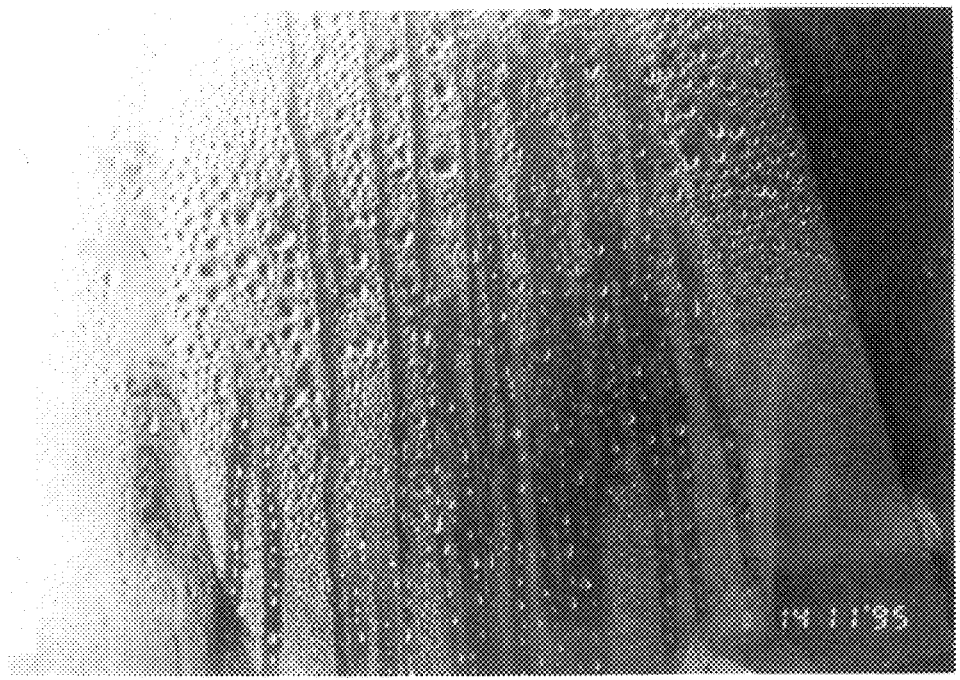
FIGS. 12A and 12B are photographs showing surface conditions after spraying water on polyethylene the surface of which was treated and on polyethylene the surface of which was not treated
Figure 12B:
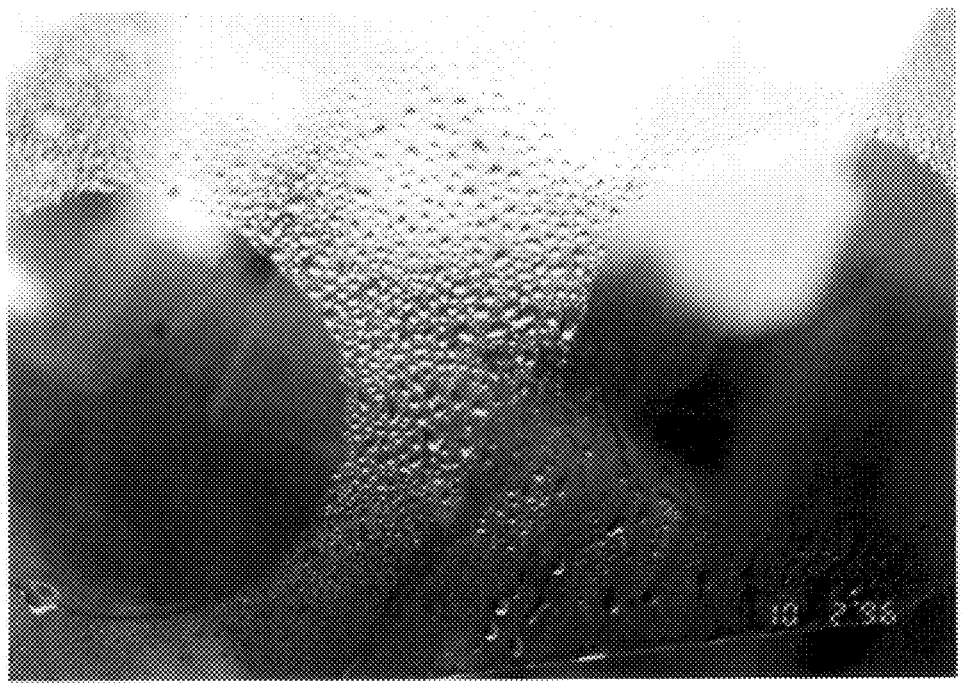

For example, in the case of PE, when water was sprayed thereon, the water droplets completely spread onto the polymer surface modified according to the present invention (shown in FIG. 12B, the circular portion (lower part of photograph)) to form a transparent mirror-like surface, while on the non-modified surface, water drops formed thereon and thus light scattering occurred (FIG. 12A).

This proves the excellent effects of surface modification in the case of PE.

(2) Test for verifying wetting angle

In the above procedure (1) samples 3-1 (ion irradiation= $10^{14}, 10^{16}, 10^{17}$), 3-2 (ion irradiation=$10^{14}, 10^{16}, 10^{17}$), 3-11 (ion irradiation=$10^{14}, 10^{16}, 10^{17}$), 3-14 (ion irradiation=$10^{17}$) were exposed to air and the wetting angles thereof were measured depending on time, and after storing samples 3-1 (ion irradiation=$10^{14}, 10^{16}, 10^{17}$), 3-2 (ion irradiation=$10^{14}$, $10^{16}, 10^{17}$), 3-11 (ion irradiation=$10^{14}, 10^{16}, 10^{17}$) for a certain time, the wetting angles were measured. The results are shown in FIGS. 13A,B,C and D.

Figure 13A:
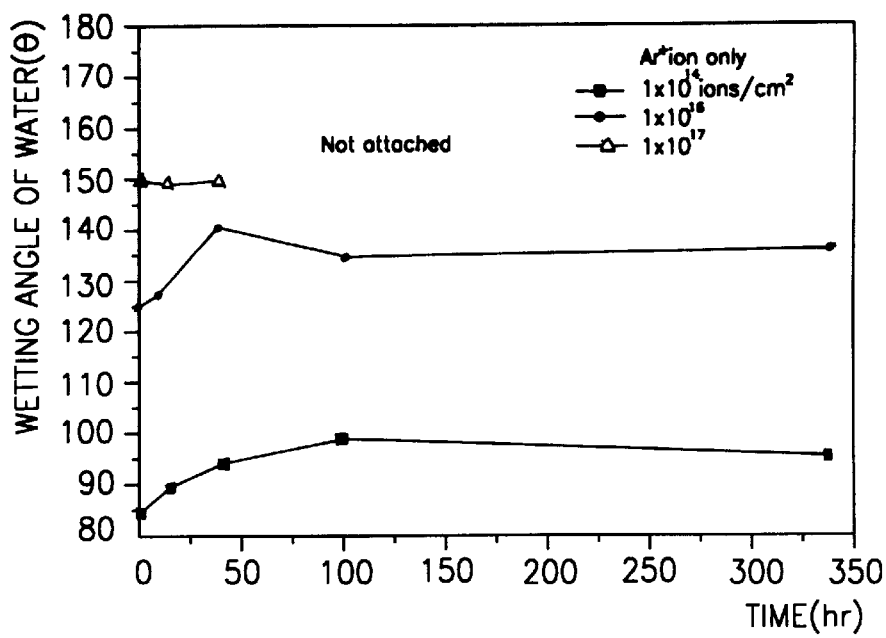
FIGS. 13A, 13B, 13C and 13D are graphs showing the results of measuring the wetting angle of samples 3-1, 3-2, 3-11 and 3-14 according to example 3-2
Figure 13B:
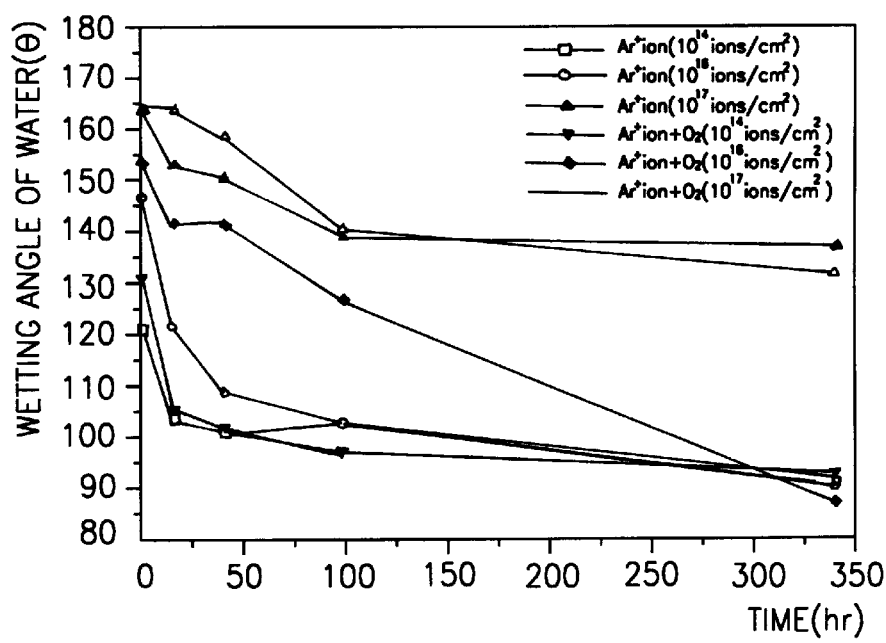

As shown in FIG. 13A, the wetting angle of the PTFE sample (3-1), which was surface-modified by only argon ions, increased somewhat over the course of time when exposed in air, but changes were minor. However, when these samples were stored in water and dried, the detected wetting angles decreased with the lapse of time (FIG. 13B). In contrast, the wetting angle of sample (3-2) which had been surface modified while blowing oxygen, prominently decreased when the sample was stored in water, as shown in FIG. 13B.

Figure 13C:
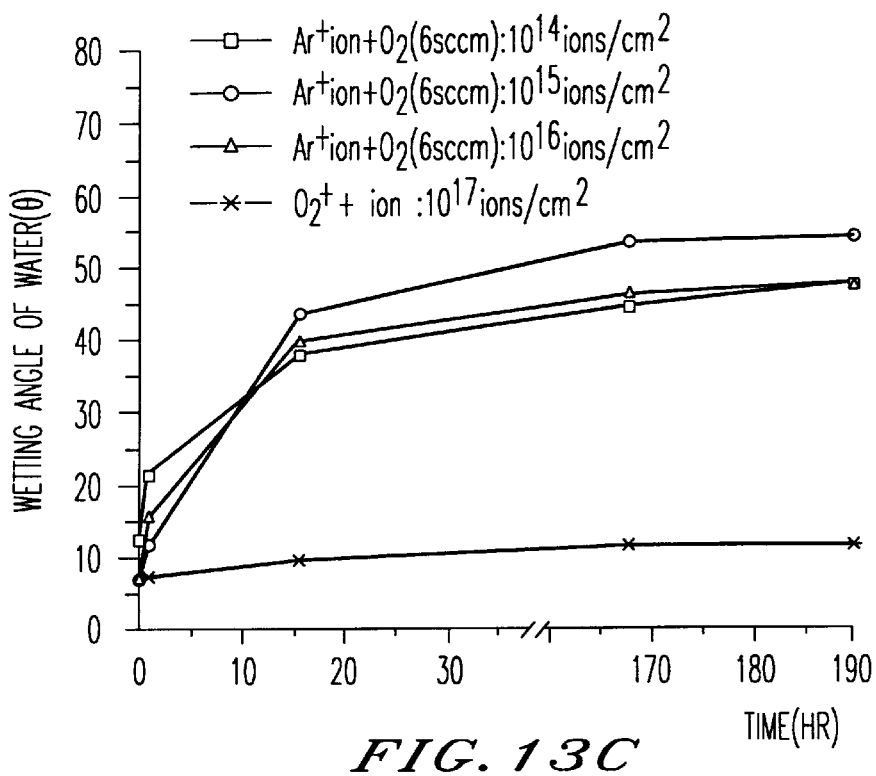
Figure 13D:
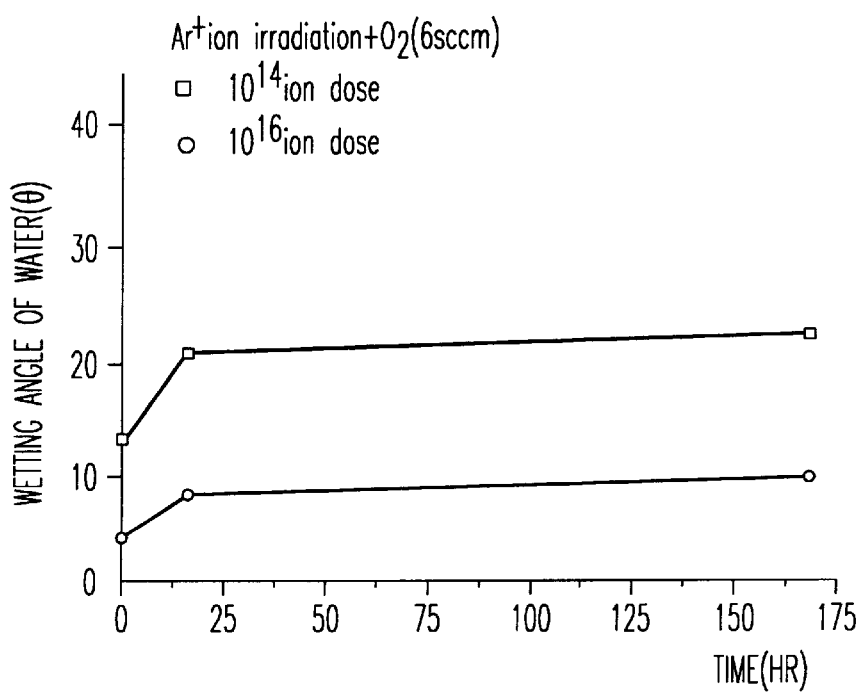

Further, in case of PET, in FIG. 13C, the wetting angle a of sample (3-11) which had been surface-modified while blowing oxygen continuously increased with the lapse of time, whereby the surface thereof changed to become hydrophobic, and when these samples were stored in water, the wetting angles did not change and maintained constant values (FIG. 13D). However, the wetting angle of sample (3-14), irradiated by only an oxygen ion beam, was almost maintained without any change with the lapse of time when the sample was exposed to air.

(3) Inspection test for formation of hydrophilic groups

Samples 3-1 and 3-2 which had been surface-modified with ion irradiation of $10^{15}, 10^{16}$ and $10^{17}$ ions/cm$^2$ were surface analyzed by ESCA, and the results are shown in FIG. 14. In addition, samples 3-10 and 3-11 surface-modified with ion irradiation of $10^{14}$, $10^{16}$ and $10^{17}$ ions/cm$^2$ as well as a sample without ion irradiation were surface analyzed by ESCA, and the results are shown in FIG. 15.

Figure 14A:
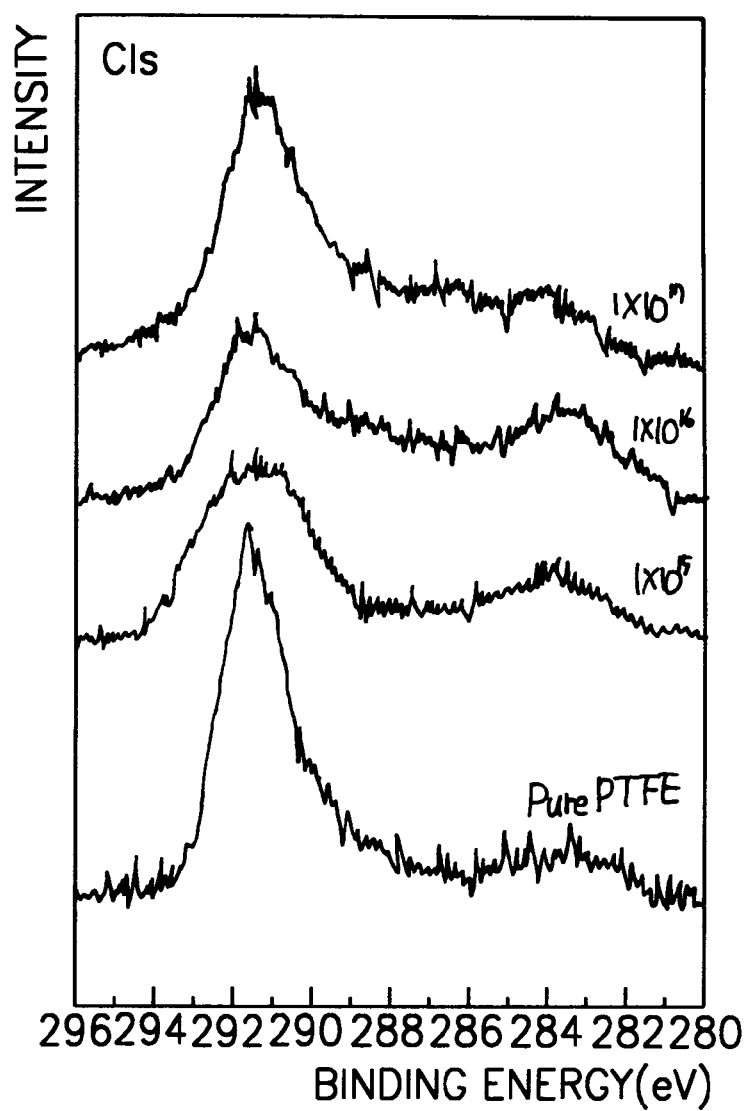
FIGS. 14A, 14B and 14C are graphs showing the results of an ESCA surface analysis of samples 3-1 and 3-2
Figure 14B:
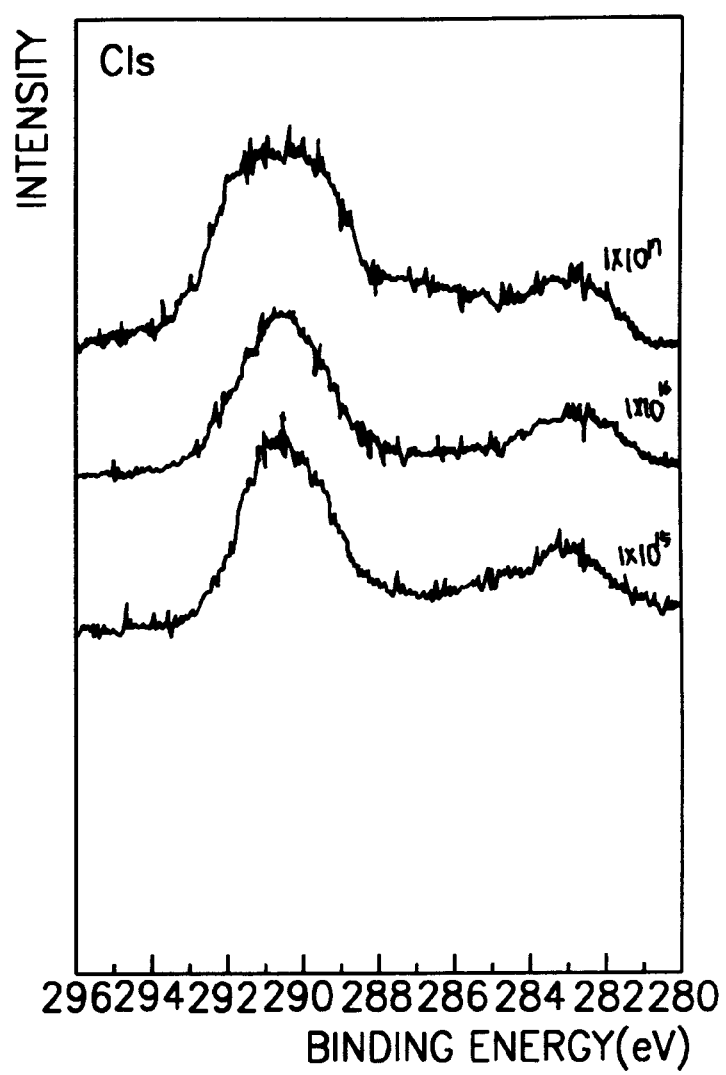
Figure 14C:
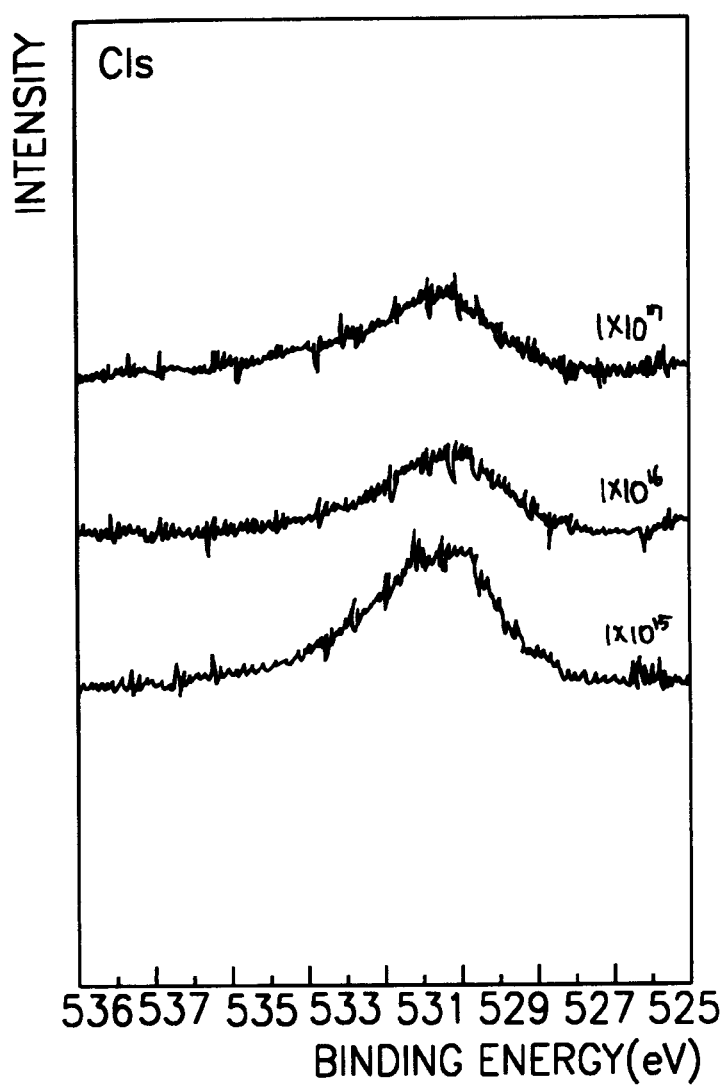

FIGS. 14A and 14B show comparative analytic results using ESCA with regard to Teflon (R). A carbon peak of 292 eV is a peak for C—F bonding and when irradiating argon ions while blowing $O_2$ around the sample, various novel bonds such as C—O, C=O, COO, or the like are formed between C—C bonds (284 eV). In the case of oxygen bond peaks, novel oxygen bonds which had not existed in the original Teflon (R), were generated (FIG. 14C).

Figure 15A:
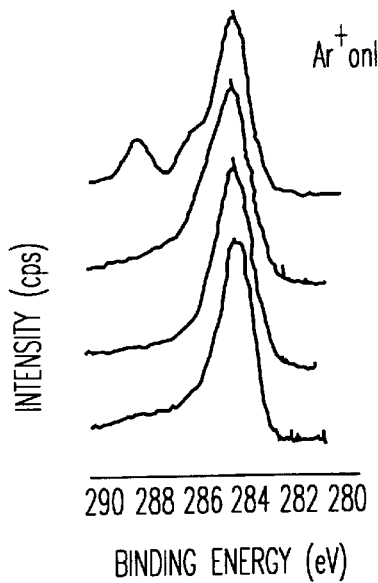
FIGS. 15A and 15B are graphs showing the results of an ESCA surface analysis of samples 3-10 and 3-11

In FIG. 15A, when only argon was irradiated onto the surface, the peaks at binding energies of 288 eV and 286 eV, i.e., C=O, C—O bonds, decreased, while when argon was irradiated while blowing oxygen around the polymer, peaks became broader at the positions of 288 eV and 286 eV where hydrophilic functional groups exist on the surface.

Figure 15B:
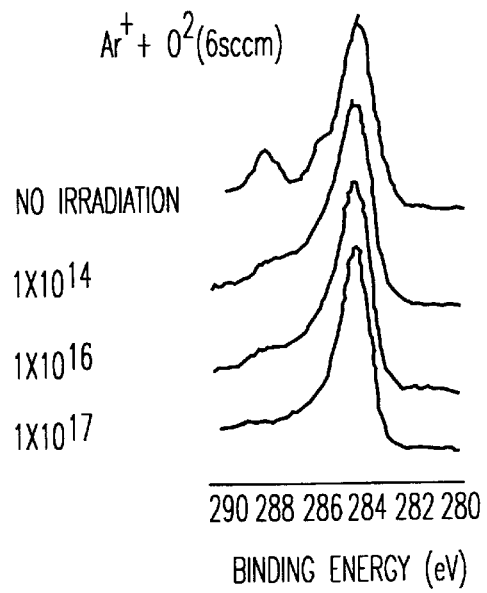
Figure 15C:
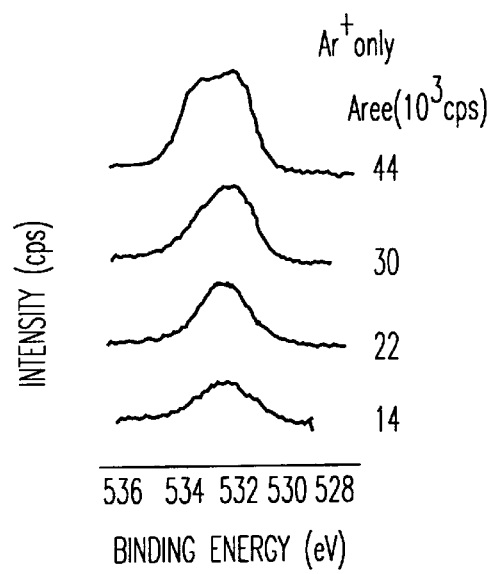
Figure 15D:
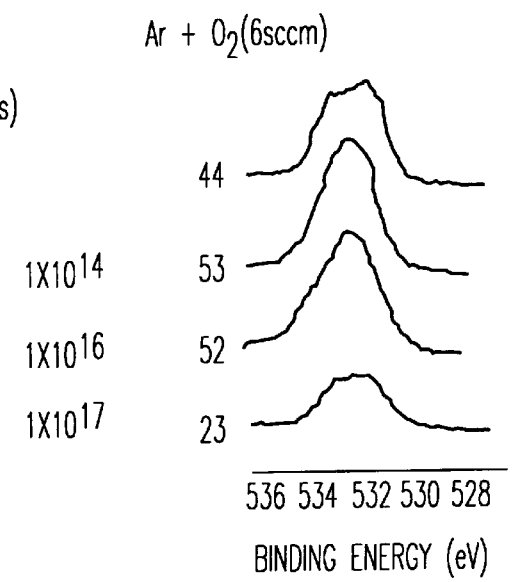

In the analytic ESCA results of PET of FIG. 15B, when irradiating only argon onto the surface, it was found that the amount of oxygen decreased as argon irradiation increased, while when irradiating argon while blowing oxygen, the amount of oxygen increased in the range of up to $10^{16}$ ions/cm$^2$. It is considered that this evidences the generation of hydrophilic functional groups on the polymer surface.

(4) Peel-off test with Scotch (R) tape

Figure 16:
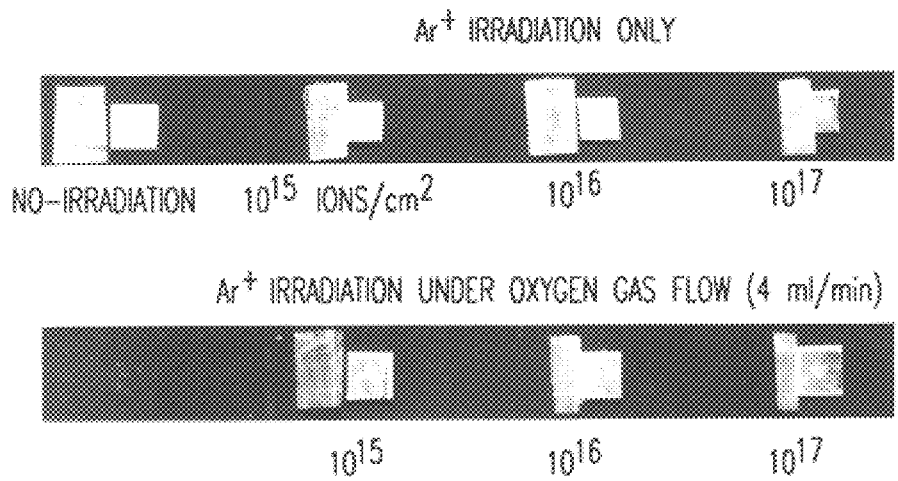
FIG. 16 is a photograph showing the results of the peel-off test with Scotch (R) tape of samples 3-1 and 3-2 on which aluminum was deposited, according to Example 3-4.
Figure 17:
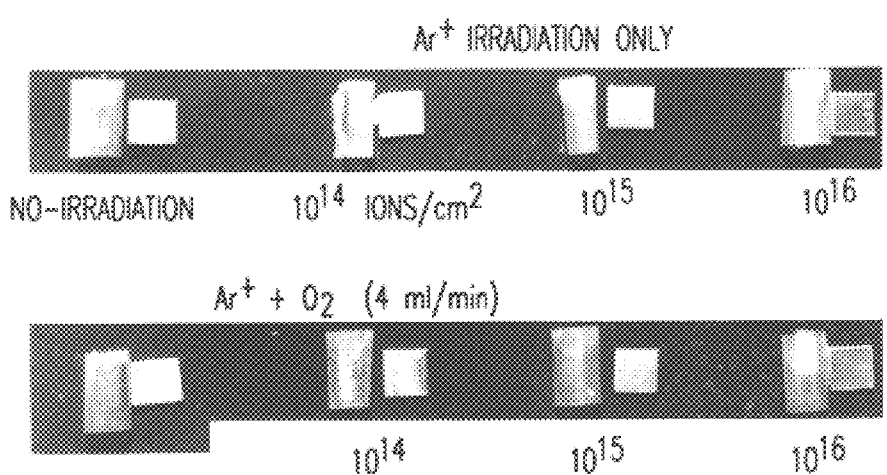
FIG. 17 is a photograph showing the results of the peel-off test with Scotch (R) tape of samples 3-1 and 3-2 on which copper was deposited.

Aluminum (2000 Å) and copper (2000 Å) were deposited on a sample without ion irradiating and samples 3-1 and 3-2 which were surface-modified with ion irradiation of $10^{15}$, $10^{16}$ and $10^{17}$ ions/cm$^2$ and then, a peel-off test with Scotch (R) tape was performed as in Example (1-5), and the results are illustrated in FIGS. 16 and 17.

In FIGS. 16 and 17, it shows that when only argon ions were irradiated, aluminum and copper were partially or totally peeled-off by Scotch (R) tape. However, when the metal was deposited after the surface was modified while blowing oxygen according to the present invention, such metals were not peeled-off.

(5) Test of adhesive strength by an adhesive

Figure 18:
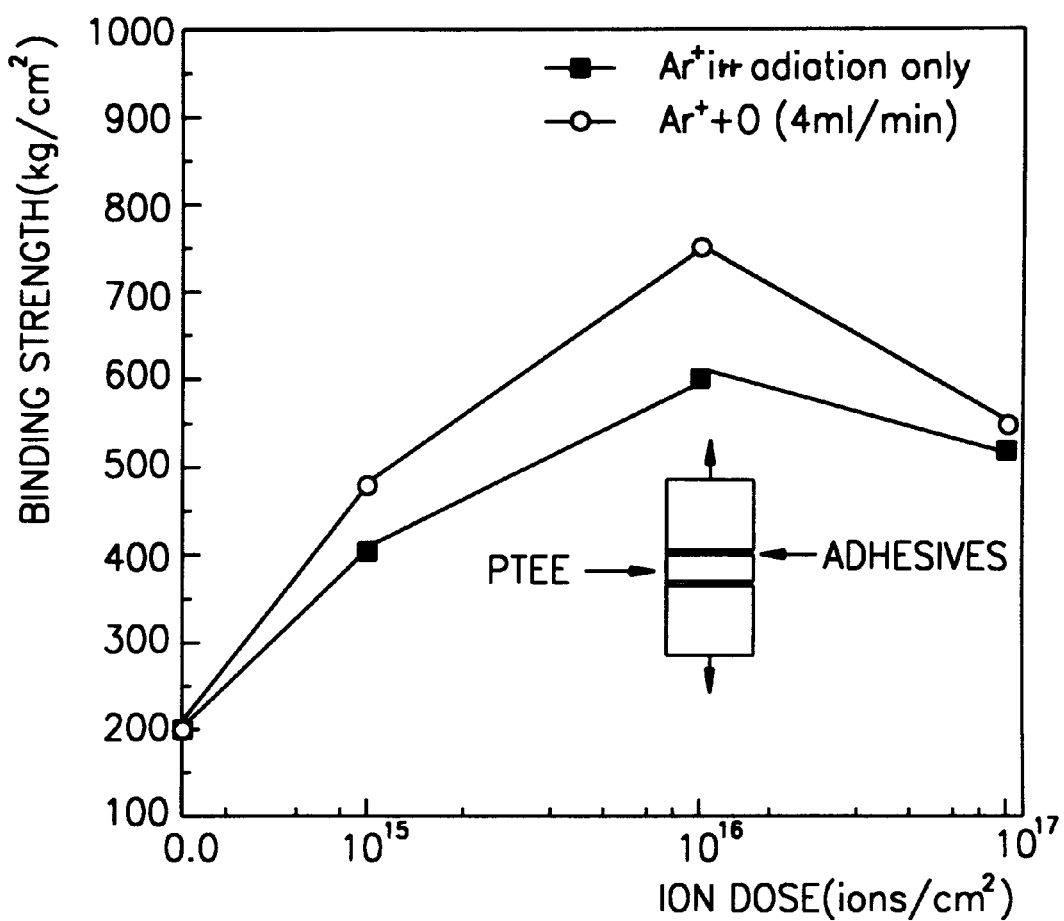
FIG. 18 is a graph showing the results of the adhesive strength test of samples 3-1 and 3-2 according to Example 3-5.

As illustrated in FIG. 18, an adhesive agent (Crystal Bond Buehler, Thermoplastic Cement No. 40-8100) was applied to both sides of surface-modified Teflon samples 3-1 and 3-2, and the adhesive strength thereof was tested. The result is shown in FIG. 18.

As shown in FIG. 18, adhesive strength increased by surface-modification with only argon irradiation of the present experiment, and adhesive strength further increased in the case of surface modification while blowing oxygen.

Example 4

An experiment for surface modification of nitride material (1) An experiment for a surface modification of an aluminum nitride and a direct bond copper An aluminum nitride substrate which was minutely polished to be very smooth was well cleaned with acetone and trichloroethylene to remove attached materials and organic materials attached on the surface and then was completely dried in a drying oven (120° C.). The aluminum nitride substrate was put in the vacuum tube and maintained under a vacuum of $10^{-5}$ torr. To remove the attached materials and the existing oxide layer, the sample surface was treated for one minute with an argon ion beam of 0.5 keV and oxygen gas was introduced onto the surface of the sample in an amount of 5 ml/min. While varying an ion introduction amount at the argon ion beam energy of 1 keV, argon ions were irradiated onto the surface of the sample. The treated sample was moved to another vacuum tube and a thin copper film was formed to have a thickness of 50–1000 Å thereon. Then, a scratch experiment was carried out to measure the bond strength of the thin copper film. The apparatus for the scratch experiment had a Knoop hardness tester and an ultrasonic sensor provided therein, and the bond strength was measured by sensing a sound wave at which the film was destroyed with the ultrasonic sensor while increasing a vertical load applied thereto and by measuring the load at the sound wave. When the bond between the substrate and the thin copper film was not properly made, a sound wave was measured while applying a load. The sample of the aluminum nitride for DBC according to the present invention exhibited a high bond strength of 30 Newtons in the scratch experiment.

Figure 22:
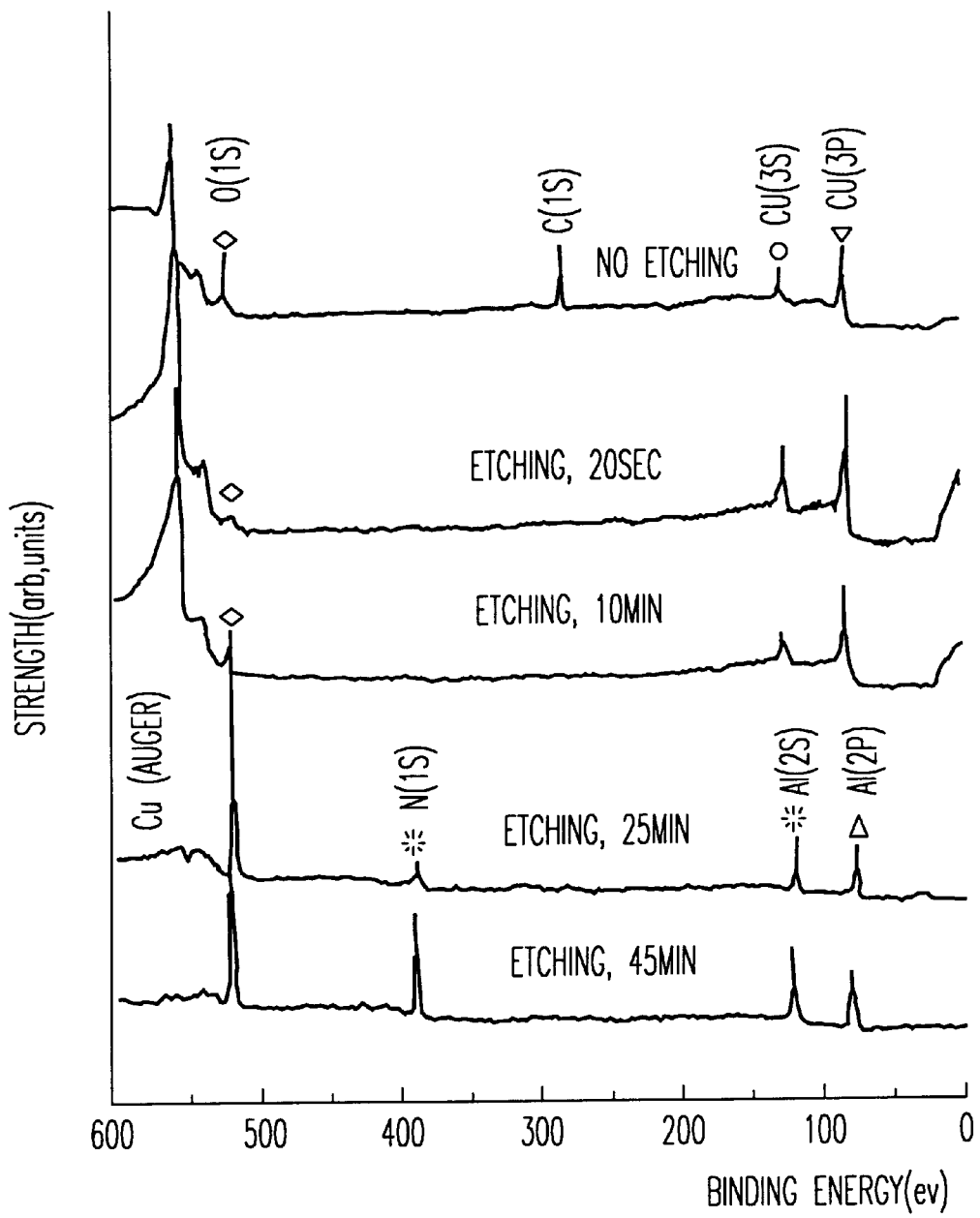
FIG. 22 is a graph showing an analysis result by an X-ray photoelectric spectrophotometer (XPS) of a boundary surface of a test piece in which a thin copper film is applied by 50 Å on the aluminum nitride substrate which is surface-treated according to the present invention (argon ion dose: $1\times10^{16}$ per unit area, oxygen flow rate: 4 ml/min)

The surface of the aluminum nitride was modified under the condition that oxygen gas flow was maintained at 4 ml/min while irradiating ion beams in a concentration of $10^{15}$ Ar$^+$/cm$^2$, and a thin copper film was formed thereon to have a thickness of 50 Å and the resultant was polished with an argon ion beam. FIG. 22 shows an analysis result by an X-ray photoelectric spectrophotometer (XPS) in accordance with the thicknesses. First, a copper peak appeared and then the copper and the oxygen peak appeared coexistent in accordance with etching. Then the aluminum and oxygen peaks appeared and finally, aluminum and nitrogen peaks appeared. As a result, it was identified that by the ion beam treatment under an oxygen atmosphere at room temperature, a chemical bond between oxygen and metal ions was made at room temperature and accordingly Cu—O and Al—O bonds which provide a great bond strength between the copper and the aluminum nitride substrates were formed.

2) Scotch (R) tape bonding experiment

A Scotch tape bonding experiment was conducted to observe the enhancement of bonding force.

A sputtering of a thin copper film was carried out on the surface-modified aluminum nitride substrate obtained from the above-described experiment and then a Scotch (R) tape was attached thereon to observe a basic bonding state, the result of which is shown in Table 4. It was seen that the bonding was not made on the non-modified substrate. On the other hand, an excellent bonding was made when irradiating ions at $10^{14}$ to $5 \times 10^{16}$ ions/cm$^2$ while introducing oxygen onto the surface of the aluminum nitride surface and the bonding was not disrupted by the Scotch (K) tape. Further, an oxide layer existing on the surface of the aluminum nitride was eliminated by using 0.05 micron of gamma aluminum powder, and then in the same way as for the first embodiment, oxygen was introduced or ion beams were irradiated onto the surface without oxygen gas, and then the adhesion experiment of the Scotch tape was conducted. As a result, it was observed that the thin copper film was not separated irrespective of the introduction of oxygen. As a result of a identification in RBS, 100 Å of an oxide layer was found on the surface of the sample to which oxygen was not provided. However, the thin copper film of the sample not treated with ion beams was easily separated when the tape experiment was conducted.

TABLE 4

|   | PT (1keV,min) | KIB & AI (1/cm$^2$) | KG & IA (ml/min) | AE (STE) |
|---|---|---|---|---|
| 1 | 1 minute | argon, 1 × 10$^{15}$ | oxygen, 4 | detached |
| 2 | 1 minute | argon, 1 × 10$^{16}$ | oxygen, 4 | attached |
| 3 | 1 minute | argon, 1 × 10$^{17}$ | oxygen, 4 | detached |
| 4 | 1 minute | argon, 1 × 10$^{15}$ | oxygen, 4 | attached |
| 5 | I minute | argon, 1 × 10$^{16}$ | oxygen, 4 | attached |
| 6 | 1 minute | argon, 1 × 10$^{17}$ | oxygen, 4 | detached |
| 7 | 1 minute | argon, 1 × 10$^{15}$ | oxygen, 4 | detached |
| 8 | 1 minute | argon, 1 × 10$^{16}$ | oxygen, 4 | detached |

*PT: pre-treatment
KIB * AI: kinds of ions and amount of ions
KG & IA: kinds of gases and the introduction amount
AE (STE): adhesion force experiment (Scotch tape experiment)

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A process of modifying a surface of a nitride substrate, comprising:

simultaneously irradiating said surface of said nitride substrate with ion particles in an ion beam obtained by ionizing argon, oxygen, air, krypton or mixtures thereof and directing a flow of a reactive gas selected from the group consisting of oxygen, nitrogen, hydrogen, ammonia, carbon monoxide and mixtures thereof onto said surface being bombarded by the ion beam in a vacuum at ambient temperature thereby chemically forming an oxide layer by reaction with the surface of the nitride substrate.

2. The process of claim 1, wherein the reactive gas is oxygen.

3. The process of claim 1, wherein the reactive gas is introduced in an amount of 1–8 ml/min.

4. The process of claim 1, wherein the nitride surface is aluminum nitride and wherein the oxide is aluminum oxide.

5. The process of claim 1, wherein the ion particles have an energy of 0.5 keV–2.5 keV.

6. The process of claim 1, wherein an amount of the ion particles which irradiate said surface ranges from $1 \times 10^{14}$ to $5 \times 10^{16}$ ions/cm$^2$.

7. The process of claim 1, wherein an initial pressure within a chamber housing the nitride object at the start of ion particle bombardment is $10^{-5}$–$10^{-6}$ Torr and increases to a processing pressure of $10^{-3}$ to $5 \times 10^{-4}$ Torr, which is maintained throughout the process.

8. The process of claim 1, wherein the ion beam contains ionized oxygen or said reactive gas contains oxygen.

9. A process of modifying an aluminum nitride substrate to form a copper coated nitride substrate, comprising:

simultaneously irradiating a surface of said aluminum nitride substrate with ion particles in an ion beam obtained by ionizing argon, oxygen, air, krypton or mixtures thereof and directing a flow of a reactive gas selected from the group consisting of oxygen, nitrogen, hydrogen, ammonia, carbon monoxide and mixtures thereof onto said surface being bombarded by the ion beam in a vacuum at ambient temperature, thereby chemically forming an oxide layer on the surface of the aluminum nitride substrate; and sputtering a copper film onto the oxide layer, thereby forming a copper layer on the oxide layer.

* * * * *